(12) United States Patent
Benjamin et al.

(10) Patent No.: US 7,802,927 B2
(45) Date of Patent: Sep. 28, 2010

(54) BENT OPTICAL FIBER COUPLERS AND OPTO-ELECTRICAL ASSEMBLIES FORMED THEREFROM

(75) Inventors: Seldon David Benjamin, Painted Post, NY (US); Richard Robert Grzybowski, Corning, NY (US); Brewster Roe Hemenway, Jr., Painted Post, NY (US); Christopher Paul Lewallen, Hudson, NC (US); James Phillip Luther, Hickory, NC (US); Wolfgang Gottfried Tobias Schweiker, Weyarn (DE); James Scott Sutherland, Corning, NY (US)

(73) Assignee: Corning Cable Systems LLC, Hickory, NC (US)

( * ) Notice: Subject to any disclaimer, the term of this patent is extended or adjusted under 35 U.S.C. 154(b) by 0 days.

(21) Appl. No.: 12/432,799

(22) Filed: Apr. 30, 2009

(65) Prior Publication Data

US 2009/0297099 A1 Dec. 3, 2009

Related U.S. Application Data

(60) Provisional application No. 61/130,481, filed on May 30, 2008, provisional application No. 61/130,482, filed on May 30, 2008.

(51) Int. Cl.
*G02B 6/36* (2006.01)
(52) U.S. Cl. .............................. 385/88; 385/52; 385/53; 385/31; 385/32; 385/92
(58) Field of Classification Search ................... 385/31, 385/32, 38, 39, 42, 52, 53, 88, 89, 92, 94, 385/139, 33, 34
See application file for complete search history.

(56) References Cited

U.S. PATENT DOCUMENTS 3,936,631 A * 2/1976 Muska ................. 250/227.24
3,982,123 A * 9/1976 Goell et al. ............ 250/227.24
4,557,550 A * 12/1985 Beals et al. .................... 385/32

(Continued)

FOREIGN PATENT DOCUMENTS

GB 2256286 4/1992

(Continued)

OTHER PUBLICATIONS

International Telecommunication Union, ITU-T G.652, Telecommunication Standardization Section of ITU, Jun. 2005, Series G: Transmission Systems and Media, Digital Systems and Networks, Transmission media characteristics—Optical fibre cables, Characteristics of a single-mode optical fibre and cable, ITU-T Recommendation G.652, 22 pgs.

(Continued)

*Primary Examiner*—Brian M Healy

(57) ABSTRACT

A bent optical fiber coupler (100) that employs at least one optical fiber (10) is disclosed. The coupler includes a curved optical fiber guide channel (200) having a strong curve. The optical fiber(s) held within the optical fiber guide channel have a bend corresponding to the guide channel curve. The fiber end portions are optionally disposed within a straight fiber guide (160) at a coupler input/output end, which is preferably configured to have a standard connector geometry. Use of nanostructured fibers for the at least one optical fiber allows for strong bends having tight radii of curvature without imparting significant attenuation. Coupler assemblies that include the coupler optically coupled to at least one optoelectronic device (310) are also disclosed.

22 Claims, 25 Drawing Sheets

U.S. PATENT DOCUMENTS

| | | | |
|---|---|---|---|
| 4,696,534 A * | 9/1987 | Saha .......................... 385/32 |
| 4,768,854 A * | 9/1988 | Campbell et al. ............. 385/32 |
| 4,834,482 A * | 5/1989 | Campbell et al. ............. 385/32 |
| 4,989,939 A * | 2/1991 | Cox et al. ..................... 385/32 |
| 5,260,957 A | 11/1993 | Hakimi et al. |
| 5,375,183 A | 12/1994 | Edwards et al. |
| 5,881,200 A | 3/1999 | Burt |
| 6,081,639 A * | 6/2000 | Kagami et al. ................ 385/32 |
| 6,343,171 B1 | 1/2002 | Yoshimura et al. |
| 6,402,389 B1 | 6/2002 | Steijer et al. |
| 6,577,801 B2 | 6/2003 | Broderick et al. |
| 6,594,435 B2 | 7/2003 | Tourne |
| 6,665,469 B1 * | 12/2003 | Schroll et al. ................ 385/32 |
| 6,710,366 B1 | 3/2004 | Lee et al. |
| 6,742,936 B1 | 6/2004 | Knecht et al. |
| 6,856,742 B2 | 2/2005 | Broeng et al. |
| 6,939,058 B2 | 9/2005 | Gurevich et al. |
| 6,968,107 B2 | 11/2005 | Belardi et al. |
| 7,054,513 B2 | 5/2006 | Herz et al. |
| 7,162,124 B1 | 1/2007 | Gunn, III et al. |
| 7,184,669 B2 | 2/2007 | Gordon |
| 7,228,020 B2 | 6/2007 | Weigert |
| 7,263,248 B2 | 8/2007 | Windover |
| 7,360,955 B2 | 4/2008 | Suzuki et al. |
| 2003/0031428 A1 | 2/2003 | Wickman et al. |
| 2003/0091290 A1 | 5/2003 | Whitehead |
| 2005/0152650 A1 | 7/2005 | Knickerbocker et al. |
| 2006/0115217 A1 | 6/2006 | Childers et al. |
| 2006/0269192 A1 | 11/2006 | Hayasaka |
| 2007/0086723 A1 | 4/2007 | Sasaki et al. |
| 2007/0201797 A1 | 8/2007 | Grzybowski et al. |
| 2007/0292081 A1 | 12/2007 | Hashimoto et al. |
| 2008/0025674 A1 | 1/2008 | Sasaki |

FOREIGN PATENT DOCUMENTS

| | | |
|---|---|---|
| WO | WO 03/003060 | 1/2003 |
| WO | WO 2005/031417 | 4/2005 |

OTHER PUBLICATIONS

International Telecommunication Union, ITU-T G.657, Telecommunication Standardization Section of ITU, Dec. 2006, Series G: Transmission Systems and Media, Digital Systems and Networks, Transmission media and optical systems characteristics—Optical Fibre Cables, Characteristics of a bending loss insensitive single mode optical fibre and cable for the access network, ITU-T Recommendation G.657, 20 pgs.

* cited by examiner

BENT OPTICAL FIBER COUPLERS AND OPTO-ELECTRICAL ASSEMBLIES FORMED THEREFROM

CROSS-REFERENCE TO RELATED APPLICATIONS

This application claims the benefit of priority to U.S. Provisional Application No. 61/130,481, filed May 30, 2008, entitled, "Bent Optical Fiber Couplers and Opto-Electrical Assemblies."

This application is related to U.S. patent application Ser. No. 11/729,573, entitled "Right-angle Optical Fiber Connector Assembly," filed in the United States on Mar. 29, 2007 (now US Publication 2008/0240657 A1), which application is incorporated by reference herein.

This application is also related to U.S. Provisional Application No. 61/130,482, filed May 30, 2008, entitled, "Fiber Assembly Employing Photonic Band-Gap Optical Fiber," which application is incorporated by reference herein.

BACKGROUND

The present invention relates generally to optical fiber couplers, and in particular relates to optical fiber couplers employing bent optical fibers, and assemblies formed from such optical fiber couplers.

TECHNICAL FIELD

Optical fiber connectors are used in a variety of applications where a set of one or more optical fibers needs to be connected to an external device, such as another set of one or more optical fibers, a circuit board, or an apparatus adapted to receive and transmit light. For example, optical fiber cables require connectors adapted to connect to and link discrete segments of optical fibers.

Certain optical and electrical-optical devices have circuit boards that need to be interfaced with one or more optical fibers so that optical signals can be received and processed by the device, and also transmitted from the device to another device or to a back plane. This often requires plug-in or receptacle optical connectors that, in some respects, may be similar to plug-in and receptacle electrical connectors used for electrical circuit-board components. Alternatively, such an interface may be accomplished with a connector end adapted to be permanently (or semi-permanently) fixed to the circuit board to establish and maintain optical communication with corresponding devices (e.g., photodetector or phototransmitters) on the circuit board. Because interior space is typically at a premium for most optical and electrical-optical devices, the optical connectors are preferably compact so that they can fit into tight spaces when connecting to a circuit board housed within the device. The fact that space is also at a premium on the circuit board makes establishing the circuit-board optical interconnection even more challenging.

Unfortunately, most optical fiber connectors and the optical fibers connected thereto do not allow for readily accessing and connecting to a circuit board housed in the tight confines of most optical and opto-electronic devices because connection requires introducing significant bending loss in the optical fibers. This is particularly true where the connection needs to be formed at a right angle with a sufficiently tight radius, either in plane or out of plane, while maintaining both low loss and high reliability.

As communication bandwidth requirements rise inside high-density computer and communications equipment, cost-effective high-band-width approaches to routing optical signals from sources to receivers are becoming increasingly necessary. A key requirement of such routing is to simultaneously preserve low link loss and tight bend performance. Low loss is required for power efficiency and link performance, while tight bend performance is required for flexible design, to route around other components and to manipulate the optical signals through various bends and turns in tight spaces.

SUMMARY

A first aspect is an optical coupler. The optical fiber coupler is formed from upper and lower fiber alignment members. The upper alignment member has a concave surface and the lower fiber alignment member has a convex surface. The lower fiber alignment member also has a bottom surface defining a coupler output end. The upper and the lower fiber alignment members are arranged to form a first fiber guide channel defining a first coupler input/output (I/O) end, and a central curve defined by the convex and concave surfaces. The coupler includes at least one optical fiber having an end portion with a proximal end face. In an example embodiment, the at least one optical fiber includes at least one nanostructured optical fiber. At least a portion of the at least one optical fiber is held within and supported by the first fiber guide channel so as to form a bend in the at least one optical fiber corresponding to the central curve, and to position the fiber end face at or near the bottom surface of the lower fiber alignment member so as to define a second coupler I/O end.

A second aspect is an opto-electronic assembly that includes the coupler as described above and an opto-electronic device. The opto-electronic device is optically coupled the second I/O end of the coupler. The opto-electronic device includes at least one of an optical detector, an optical light source, and at least one vertical-cavity surface-emitting laser (VCSEL).

A third aspect is a method of forming an optical coupler. The method includes providing at least one optical fiber having an end portion with a proximal end face, and holding the at least one optical fiber between respective concave and convex surfaces of upper and lower fiber alignment guides so as to form and support a bend in the at least one optical fiber. In an example embodiment, the at least one optical fiber has an attenuation increase of less than or equal to 5 dB at a wavelength of 1550 nm when subject to one turn around a 10 mm diameter mandrel. In another example embodiment, the bend formed in the at least one optical fiber does not cause an attenuation of greater than 0.1 dB. The method further may include at least partially bending the at least one optical fiber over the convex surface of the lower alignment guide, and irradiating the bend in the at least one optical fiber with a laser beam prior to holding the at least one optical fiber between the respective concave and convex surfaces of the upper and lower fiber alignment guides.

A fourth aspect is an optical coupler. The optical coupler includes a coupler body having a top surface, bottom surface and a central fiber guide channel formed in the top surface. The guide channel is sized to accommodate a fiber ribbon and has a convex curved surface and input and output ends. The optical coupler also includes an optical fiber guide formed integral with the coupler body and arranged at the channel output end and having a plurality of holes open to the bottom surface and defining an I/O end. The optical coupler includes a fiber ribbon comprising a plurality of optical fibers with respective end portions and proximal end faces. The fiber ribbon is disposed in the central fiber guide channel so as to have a bend, and to position end portions of the optical fibers within the fiber guide holes so that the fiber end faces are disposed at the coupler I/O end. The optical coupler further includes a clamp having a convex surface that covers the fiber ribbon within the central fiber guide channel and that serves to secure the fiber ribbon therein.

A fifth aspect is an optical coupler method. The method includes providing an optical fiber ribbon that has an end portion. The method also includes disposing the fiber in a central fiber guide channel of a coupler body so as to have a bend. The method further includes positioning the fiber end portion within a hole of an end fiber guide of the coupler body so that the fiber end portion extends from an end of the end fiber guide. The method also includes laser processing the fiber end portion that extends from the end of the end fiber guide to form a fiber end face.

Additional features and advantages are set forth in the detailed description that follows, and in part will be readily apparent to those skilled in the art from that description or recognized by practicing the various principles of the invention as described herein, including the detailed description that follows, the claims, as well as the appended drawings. It is to be understood that both the foregoing general description and the following detailed description present exemplary embodiments of the invention. The accompanying drawings are included to provide a further understanding of aspects of the invention, and are incorporated into and constitute a part of this specification. The drawings illustrate various exemplary embodiments of the invention, and together with the detailed description, serve to explain the principles and operations thereof

BRIEF DESCRIPTION OF THE DRAWINGS

These and other features, aspects and advantages of the present invention are better understood when the following detailed description is read with reference to the accompanying drawings, in which.

DETAILED DESCRIPTION

Figure 1:
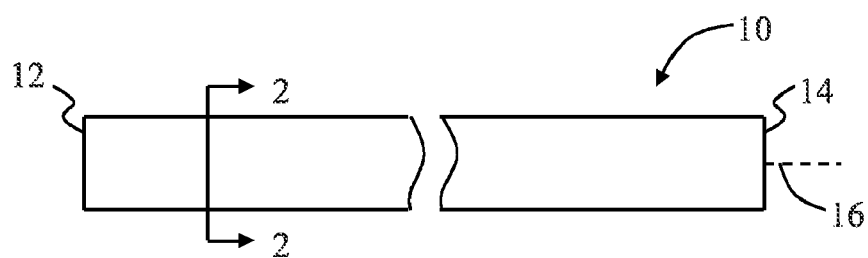
FIG. 1 is a side view of a section of nanostructured fiber.

Reference is now made to embodiments of the invention, examples of which are illustrated in the accompanying drawings. Whenever possible, the same reference numbers and symbols are used throughout the drawings to refer to the same or like parts. In the description below, terms such as "upper," "lower," "front," "back," "top,", "bottom," "vertical," "horizontal," and the like, are relative terms used for the sake of description and are not used in a limiting sense.

Definitions and Terminology

In the description below, the "refractive index profile" is the relationship between refractive index or relative refractive index and waveguide fiber radius. The "relative refractive index percent" is defined as $\Delta_i(\%)=[(n_i^2-n_c^2)/2n_i^2]\times100$, where $n_i$ is the maximum refractive index in region i, unless otherwise specified, and $n_c$ is the average refractive index of the cladding region, as discussed below. In an example embodiment, $n_c$ is taken as the refractive index of an inner annular cladding region 32, as discussed below.

As used herein, the relative refractive index percent is represented by $\Delta(\%)$ or just "$\Delta$" for short, and its values are given in units of "%", unless otherwise specified or as is apparent by the context of the discussion.

In cases where the refractive index of a region is less than the average refractive index of the cladding region, the relative refractive index percent is negative and is referred to as having a "depressed region" or a "depressed index," and is calculated at the point at which the relative refractive index is most negative unless otherwise specified. In cases where the refractive index of a region is greater than the average refractive index of the cladding region, the relative refractive index percent is positive and the region can be said to be raised or to have a positive index.

An "updopant" is herein considered to be a dopant, which has a propensity to raise the refractive index relative to pure undoped $SiO_2$. A "downdopant" is herein considered to be a dopant, which has a propensity to lower the refractive index relative to pure undoped $SiO_2$. An updopant may be present in a region of an optical fiber having a negative relative refractive index when accompanied by one or more other dopants that are not updopants. Likewise, one or more other dopants that are not updopants may be present in a region of an optical fiber having a positive relative refractive index. A downdopant may be present in a region of an optical fiber having a positive relative refractive index when accompanied by one or more other dopants that are not downdopants. Likewise, one or more other dopants that are not downdopants may be present in a region of an optical fiber having a negative relative refractive index.

Other techniques to form depressed index regions besides the use of downdopants, such as through the use of "nanostructures," are used in example embodiments and are described in greater detail below. Nanostructures include, for example, non-periodic and periodic discrete microvoids occurring along the length of the fiber and having a diameter in fiber cross-section of greater than 5 nm (nanometer) and less than 1550 nm (for example greater than 5 nm with an average diameter of approximately 250 nm). The terms voids and holes can be used interchangeably and mean a portion of the optical fiber that contains empty space or a gas.

The mode field diameter (MFD) is a measure of the spot size or beam width of light across the end face of an optical fiber. MFD is a function of source wavelength and the fiber geometry, i.e., fiber core radius and fiber refractive index profile. The vast majority of the optical power propagating in an optical fiber travels within the fiber core, with a small amount of power propagating in the cladding as an evanescent field. Mismatches in the MFD can affect splice and connector loss. The MFD is measured using the Peterman II method wherein, 2w=MFD, and $w^2=(2\int f^2 r dr / \int [df/dr]^2 r dr)$, the integral limits being 0 to ∞. A method of experimentally measuring the MFD is the variable aperture method in the far field (VAMFF), which is described in the article by Parton, J. R., "Improvements in the Variable Aperture Method for Measuring the Mode-Field Diameter of a Dispersion-Shifted Fiber," *Journal of Lightwave Technology*, Vol. 7, No. 8, August 1989 (pp. 1158-1161), which article is incorporated by reference herein. The MFD is measured in irradiance, which is optical power per unit area ($W/cm^2$).

For a Gaussian power distribution in a single-mode optical fiber, the MFD is measured between points at which the electric and magnetic field strengths are reduced to 1/e of their maximum values. As used herein, MFD assumes a given wavelength (e.g., 1550 nm) unless otherwise noted.

A related concept to MFD is the "effective area" of an optical fiber, which is defined as: $A_{eff}=2\pi(\int f^2 r dr)^2/(\int f^4 r dr)$, where r is the radial coordinate, the integration limits are 0 to ∞, and f is the transverse component of the electric field associated with light propagated in the optical fiber.

In multi-mode fibers (either the step-index or the graded-index variety), the core diameter is typically used to measure the distribution of the light beam exiting the fiber. The core size is measured optically, and in a preferred approach is defined as a diameter corresponding to a specific threshold percentage of power in the core. A standard core diameter measurement approach is set forth by the International Electrotechnical Commission (IEC) Standard IEC 60793-1-2

(2001)(see the IEC 60793-1-2 document under "Measurement methods and test procedures—Fibre geometry," Section C.4.2.2 Option 2, which document section is incorporated by reference herein by way of background information). The IEC standard is used herein as the definition of core diameter for multi-mode nanostructured fibers.

Note that MFD and the core diameter are related concepts that describe the distribution of light exiting the fiber based on a threshold amount of power. In the present invention, these parameters change by substantially the same amounts. Accordingly, the term "mode field diameter" or MFD is used in the general sense to describe the light distribution associated with either a single-mode or a multi-mode fiber, where the MFD for a single-mode fiber is defined as above, and wherein the MFD of a multi-mode fiber is defined as the core diameter according to the aforementioned IEC standard.

Nanostructured Fibers

Nanostructured optical fibers, as used in example embodiments of the optical coupler of the present invention, include nanostructured features in the form of relatively small aperiodically arranged voids that facilitate the guiding of optical-frequency electromagnetic waves in a glass fiber core in a manner that makes the optical fiber resistant to optical loss even when the fiber is bent to a small bending radius (i.e., the fiber is "bend resistant"). The nanostructured fibers otherwise operate in the same manner as standard optical fibers. This is in contrast to photonic crystal fibers, which are constituted by a periodic array of relatively large holes formed in a dielectric medium (or by an array of dielectric tubes), wherein the guiding of optical-frequency electromagnetic waves is dictated by allowed and forbidden photonic energy bands defined by the array of holes.

Nanostructured fibers have voids limited to a relatively small void-containing region wherein the air-fill percent (the area fraction of voids to the area of the optical fiber times 100%, at a pre-selected cross-section) is less than about 1% and is usually about 0.02% to about 0.2% or about 0.3%. The term nanostructured optical fiber (as used herein, and also sometimes referred to herein as micro-structured optical fiber) refers to an optical glass fiber comprising these nanometer-size features. In contrast, the holes in photonic crystal fibers occupy a large portion of the fiber and have an air-fill percent of 5% to 50%, i.e., at least five times greater, and more typically about two orders of magnitude greater than the nanostructured fibers as described herein.

Figure 2:
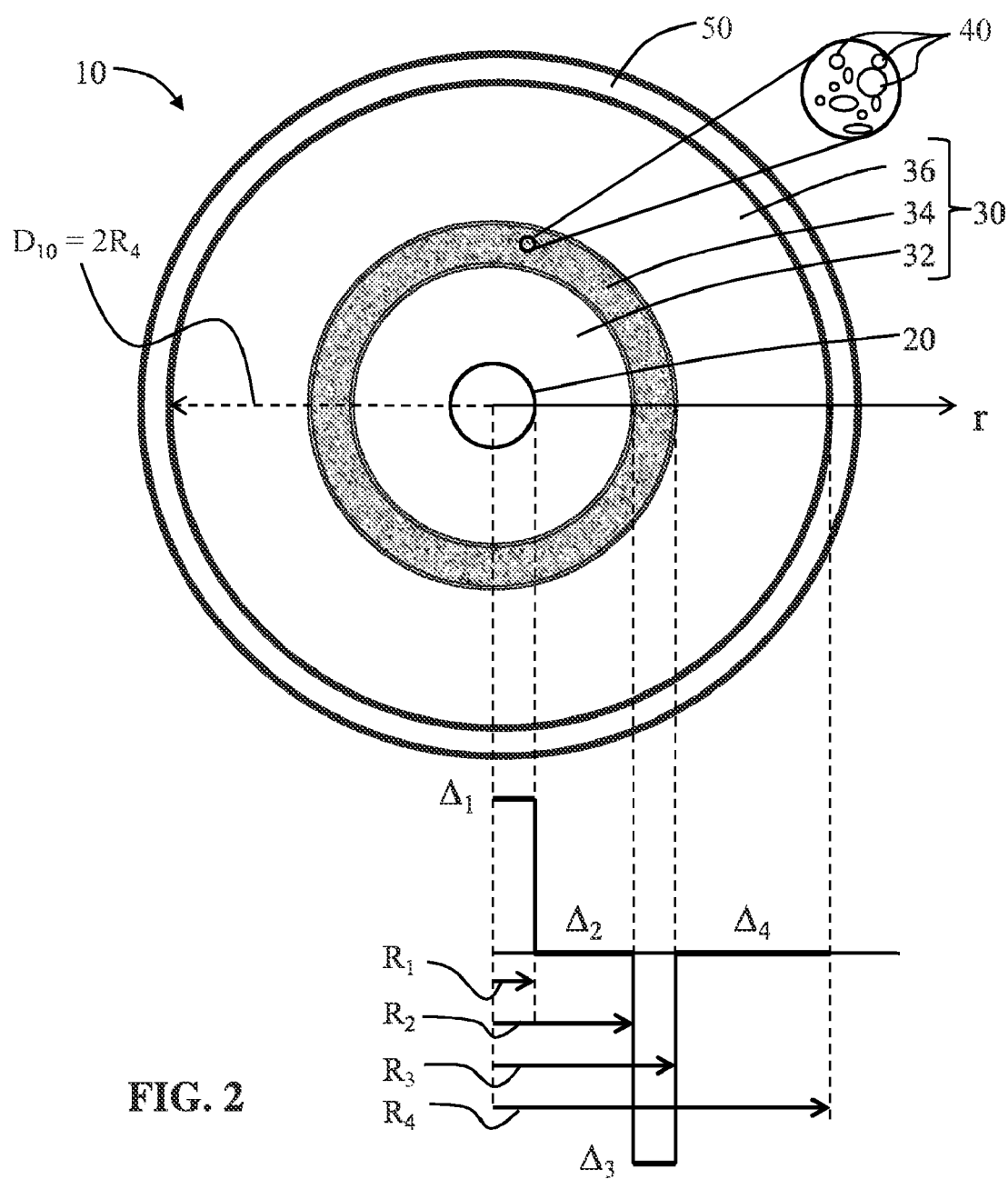
FIG. 2 is a cross-sectional view of the nanostructured fiber of FIG. 1 as viewed along 2-2 therein, along with an example effective refractive index profile for the various fiber regions.

FIG. 1 is a side view of an example embodiment of a section of nanostructured fiber 10 having opposite ends 12 and 14 (also referred to as "end faces") and a centerline 16. FIG. 2 is a cross-sectional view of nanostructured fiber 10 as viewed along the direction 2-2 of FIG. 1. Nanostructured fiber 10 includes a core region ("core") 20 made up of a single core segment having a radius $R_1$ and positive maximum relative refractive index $\Delta_1$, a cladding region ("cladding") 30 having an annular inner cladding region ("inner cladding") 32 with an inner radius $R_1$, an outer radius $R_2$ an annular width $W_{12}$ and a relative refractive index $\Delta_2$, an annular nanostructured or "void-containing" region 34 having an inner radius $R_2$, an outer radius $R_3$ an annular width $W_{23}$ and a relative refractive index $\Delta_3$, and an outer annular cladding region ("outer cladding") 36 having an inner radius $R_3$, an outer radius $R_4$, an annular width $W_{34}$ and a relative refractive index $\Delta_4$. Outer annular cladding 36 represents the outermost silica-based portion of nanostructured fiber 10. The total diameter of the "bare" fiber 10 is $D_{10}=2R_4$.

In an example embodiment $D_{10}=125$ microns, $\Delta_1$=approximately 0.34%, $R_1$=approximately 4.5 microns, $R_2$=approximately 10.7 microns, region 34 is comprised of 100 holes having a mean diameter of approximately 300 nm and a maximum diameter of <700 nm, $W_{23}$=approximately 4 microns and $\Delta_2=\Delta_4$=approximately 0%.

In another example embodiment $D_{10}=125$ microns, $\Delta_1$=approximately 0.34%, $R_1$=approximately 4.5 microns, $R_2$=approximately 13.6 microns, region 34 is comprised of about 200 holes (in a given cross-section) having a mean diameter of approximately 200 nm and a maximum diameter of <700 nm, $W_{23}$=approximately 3 microns and $\Delta_2=\Delta_4$=approximately 0%.

In yet another example embodiment $D_{10}=125$ microns, $\Delta_1$=approximately 0.34%, $R_1$=approximately 4.5 microns, $R_2$=approximately 13.6 microns, region 34 is comprised of about 400 holes (in a given cross-section) having a mean diameter of approximately 150 nm and a maximum diameter of <700 nm, $W_{23}$=approximately 3 microns and $\Delta_2=\Delta_4$=approximately 0%.

In yet another example embodiment $D_{10}=125$ microns, $\Delta_1$=approximately 0.34%, $R_1$=approximately 4.5 microns, $R_2$=approximately 12.2 microns, region 34 is comprised of about 500 holes (in a given cross-section) having a mean diameter of approximately 120 nm and a maximum diameter of <700 nm, $W_{23}$=approximately 3 microns and $\Delta_2=\Delta_4$=approximately 0%.

The fibers of the above examples, when measured by cable cutoff, are single-moded above 1260 nm.

A protective cover 50 is shown surrounding outer annular cladding 36. In an example embodiment, protective cover 50 includes one or more polymer or plastic-based layers or coatings, such as a buffer coating or buffer layer.

In an example embodiment, nanostructured region 34 is comprised of periodically or non-periodically disposed voids 40 that run substantially parallel to centerline 16 and that are configured such that the optical fiber is capable of single mode transmission at one or more wavelengths in one or more operating wavelength ranges. By "non-periodically disposed" or "non-periodic distribution," it will be understood to mean that when one takes a cross-section (such as a cross-section perpendicular to centerline 16) of the optical fiber, the non-periodically disposed voids are randomly or non-periodically distributed over the cross-section. Similar cross sections taken at different points along the length of the fiber will reveal different cross-sectional void patterns, i.e., various cross-sections will have different void patterns, wherein the distributions of voids and sizes of voids do not match. That is, the voids are non-periodic, i.e., they are not periodically disposed within the fiber structure. These voids are stretched (elongated) along the length (i.e. in a direction generally parallel to centerline 16) of the optical fiber, but do not extend the entire length of the entire fiber for typical lengths of transmission fiber. Typically, the voids extend less than 10 meters, e.g., 0.2 to 1 meter or less.

As mentioned above, the nanostructured fibers 10 suitable for use with the concepts of the present disclosure preferably include an air-fill percent less than about 1%, more preferably less than about 0.7%, and even more preferably less than about 0.3%, and even more preferably between about 0.02% and about 0.2%. An optical fiber suitable for use with the concepts of the present disclosure further has an average hole size of about 0.3 microns or less, such as 0.15 or 0.09 microns and greater than 0.005 microns. In contrast, holey fiber available from NTT, Japan, has an average hole size of about 12 microns and an air-fill percent of >1%, and typical photonic crystal fibers have air-fill percents >5%. Thus, as mentioned above, it is the small void size of the nanostructured fibers considered herein that allows the fibers to retain their circularity and nominally their original size when the voids are collapsed.

Further, because of the small size of voids 40, fibers processed using the hole collapsing methods disclosed herein are ITU-T G.652 compliant in that a 125-μm fiber is +/−1 μm in diameter for proper connectorization processing after subjecting the fiber to the hole collapsing method because of the less than 1% air-fill percent. In contrast, photonic crystal fiber, after collapsing the holes therein, has a diameter change far greater than +/−1 μm, and thus is not ITU-T G.652 compliant for connectorization. Thus, the presently disclosed methods are able to collapse voids 40 while retaining about the same cross-sectional diameter and circularity, making the fibers and methods advantageous for mounting within a ferrule.

For a variety of applications, it is desirable for the voids 40 of the nanostructured fibers 10 considered herein to have greater than about 95% of and preferably all of the voids exhibit a mean diameter in the cladding for the optical fiber that is less than 1550 nm, more preferably less than 775 nm, most preferably less than 390 nm and in some embodiments less than 250 nm and greater than 5 nm. Likewise, it is preferable that the maximum diameter of the voids in the fiber be less than 7000 nm, more preferably less than 4000 nm, more preferably less than 1550 nm, and most preferably less than 775 nm and in some embodiments less than 300 nm. In some embodiments, the fibers disclosed herein have greater than 50 voids, in some embodiments also greater than 200 voids, and in other embodiments the total number of voids is greater than 500 voids, while still in other embodiments the total number of voids is greater than 1000 voids in a given optical fiber cross section taken perpendicular to the centerline. Of course, the most preferred fibers will exhibit combinations of these characteristics. Thus, for example, one particularly preferred embodiment of optical fiber would exhibit greater than about 200 voids in the optical fiber, the voids having a maximum diameter less than 1550 nm and a mean diameter less than 775 nm, for example, the maximum diameter is less than 775 nm and the mean diameter of about 200 nm, although useful and bend resistant optical fibers can be achieved using larger and greater numbers of voids. The hole number, mean diameter, maximum diameter, and total void area percent of voids can all be calculated by using a scanning electron microscope at a magnification of about 800× and image analysis software, such as ImagePro, which is available from Media Cybernetics, Inc. of Silver Spring, Md., USA.

Because the nanostructured fibers 10 as described herein rely on the core-cladding index difference to guide light, the fiber can generally include germania or fluorine to adjust the refractive index of the core and/or cladding of the optical fiber, but these dopants can also be avoided in the intermediate annular region. The voids (in combination with any gas or gases that may be disposed within the voids) can be used to adjust the manner in which light is guided down the core of the fiber, particularly when the fiber is bent. The hole-containing region may consist of undoped (pure) silica, thereby completely avoiding the use of any dopants in the hole-containing region, to achieve a decreased refractive index, or the hole-containing region may comprise doped silica, e.g. fluorine-doped silica having a plurality of voids.

In one set of embodiments, the core region includes doped silica to provide a positive refractive index relative to pure silica, e.g. germania doped silica. The core region is preferably void-free.

Nanostructured fiber 10 can be made to exhibit a single-mode behavior with a cable cutoff of less than 1400 nm, more preferably less than 1260 nm; a 20 mm diameter macrobend induced loss at 1550 nm of less than 1 dB/turn, preferably less than 0.5 dB/turn, even more preferably less than 0.1 dB/turn, still more preferably less than 0.05 dB/turn, yet more preferably less than 0.03 dB/turn, and even still more preferably less than 0.02 dB/turn; a 10 mm diameter macrobend induced loss at 1550 nm of less than 5 dB/turn, preferably less than 1 dB/turn, more preferably less than 0.5 dB/turn, even more preferably less than 0.2 dB/turn, still more preferably less than 0.01 dB/turn, still even more preferably less than 0.05 dB/turn.

Nanostructured fibers 10 as contemplated for use in the coupler described below also include multi-mode nanostructured fibers that comprise, for example, a graded-index core region and a cladding region surrounding and directly adjacent to the core region, the cladding region comprising a depressed-index annular portion comprising a depressed relative refractive index, relative to another portion of the cladding (which preferably is silica which is not doped with an index of refraction altering dopant such as germania or fluorine). Preferably, the refractive index profile of the core has a parabolic shape. The depressed-index annular portion may comprise glass comprising a plurality of voids, fluorine-doped glass, or fluorine-doped glass comprising a plurality of voids. The depressed index region can be adjacent to or spaced apart from the core region.

The multi-mode nanostructured fibers considered herein also exhibit very low bend induced attenuation, in particular very low macrobending. In some embodiments, high-bandwidth is provided by a low maximum relative refractive index in the core, and low bend losses are also provided. In some embodiments, the core radius is large (e.g. greater than 10 microns, for example 25 microns and 31.25 microns), the core refractive index is approximately 2% or less (e.g. 2.0%, 1.0%, 0.90% or 0.50%), and the macrobend losses are low. Preferably, the multi-mode nanostructured optical fiber disclosed herein exhibits a spectral attenuation of less than 3 dB/km at 850 nm.

In an example embodiment, core 20 and cladding 30 are configured to provide improved bend resistance, and single-mode operation at wavelengths preferably greater than or equal to 1500 nm, in some embodiments also greater than about 1310 nm, in other embodiments also greater than 1260 nm. The optical fibers provide a MFD at a wavelength of 1310 nm preferably greater than 8.0 microns, more preferably between about 8.0 and 10.0 microns.

Example Effective Index Parameters

In one set of embodiments, nanostructured fiber 10 is single mode and has the following parameters: $0.30\% < \Delta_1 < 0.40\%$, and $3.0\,\mu m < R_1 < 5.0\,\mu m$. In some embodiments, core 20 has a refractive index profile with an alpha shape, where in some embodiments alpha is 6 or more, while in other embodiments alpha is 8 or more. In an example embodiment, a multi-mode fiber has the following, $12.5\,\mu m \leq R_1 \leq 40$ microns. In some embodiments, $25\,\mu m \leq R_1 \leq 32.5\,\mu m$, and in some of these embodiments, $R_1$ is greater than or equal to about 25 microns and less than or equal to about 31.25 microns. In an example embodiment, core 20 preferably has a maximum relative refractive index (sometimes called $\Delta_{1MAX}$) of $0.5\% \leq \Delta_1 \leq 2.0\%$. In yet another embodiment, core 20 has a maximum relative refractive index $0.9\% \leq \Delta_1 \leq 1.1\%$. In yet another embodiment, core 20 has a maximum relative refractive index $0.4\% \leq \Delta_1 \leq 0.5\%$. Such multi-mode fibers preferably exhibit a one-turn 10 mm diameter mandrel attenuation increase at a wavelength of 1550 nm, in dB, (also called 1×10 mm diameter bend loss at 1550 nm) of less than or equal to the product of two times $(1/\Delta_{1MAX})^2$. Thus for a multi-mode fiber having a core $\Delta_{1MAX}$ of 2% the 1×10 mm diameter bend loss at 1550 nm$\leq 2(1/2)^2=0.5$ dB; for a multi-mode fiber having a core $\Delta_{1MAX}$ of 1% the 1×10 mm diameter bend loss at 1550 nm$\leq 2(1/1)^2=2$ dB; and for a multi-mode fiber having a core $\Delta_{1MAX}$ of 0.5% the 1×10 mm diameter bend loss at 1550 nm$\leq 2(1/0.5)^2=8$ dB.

In an example embodiment, the hole-containing region 34 has an inner radius $R_2 \leq 20$ μm. In some example embodiments, 10 μm$\leq R_2 \leq 20$ μm. In other embodiments, 10 μm$\leq R_2 23$ 18 μm. In other embodiments, 10 μm$\leq R_2 < 14$ μm. In some embodiments, the inner annular cladding radial width $W_{12} > 1$ μm. In an example embodiment, radius $R_2 > 5$ μm, and more preferably $R_2 > 6$ μm.

Again, while not being limited to any particular width, in an example embodiment, nanostructured region 34 has a radial width 0.5 μm$\leq W_{23}$, while in other example embodiments 0.5 μm$\leq W_{23} \leq 20$ μm. In other embodiments, 2 μm$\leq W_{23} \leq 12$ μm. In other embodiments, 2 μm$\leq W_{23} \leq 10$ μm.

In an example embodiment, nanostructured region 34 has a regional void area percent of less than about 30 percent and greater than 0.5 percent, and the non-periodically disposed voids have a mean diameter of less than 1550 nm. In some embodiments, region 34 has a regional void area percent of less than about 10% and greater than 0.5% and a mean hole diameter of less than 775 nm and greater than 5 nm. In some embodiments, region 34 has a regional void area percent of less than about 6% and greater than 0.5% and a mean hole diameter of less than 300 nm and greater than 5 nm.

Figure 3:
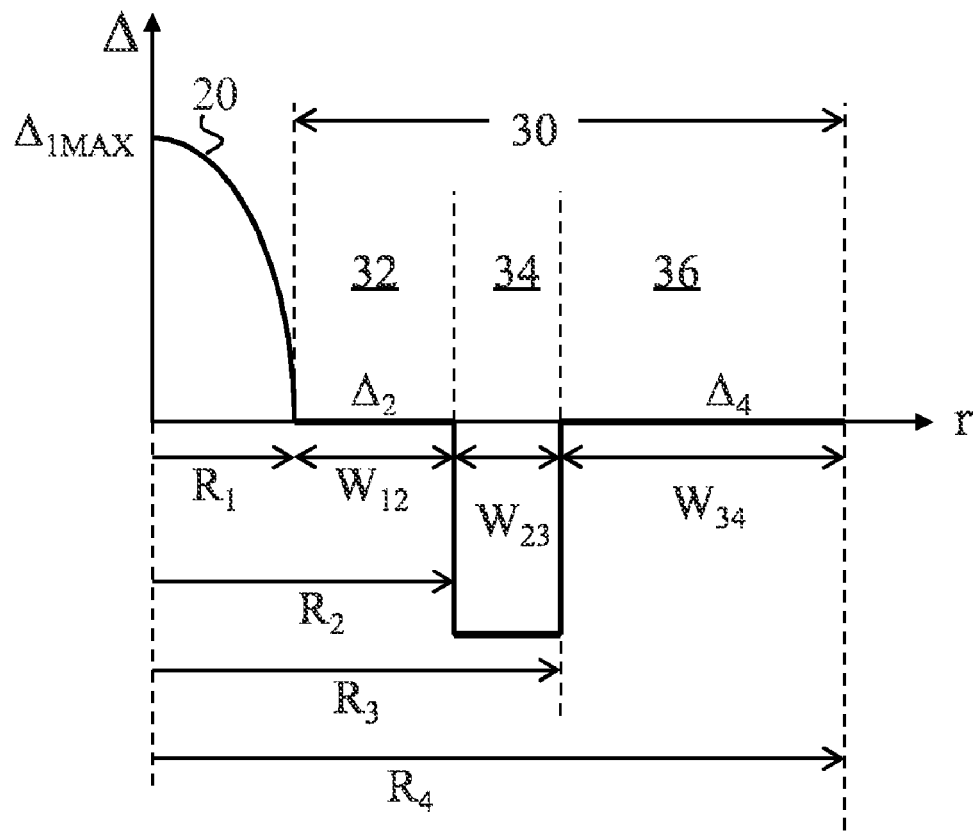
FIG. 3 is a plot of an example effective refractive index profile for an example nanostructured fiber that has a varying-index core.

FIG. 3 is a plot of the effective refractive index Δ vs. radius r, similar to the effective refractive index plot included in FIG. 2, for an example embodiment of a refractive index profile for multi-mode version of nanostructured fiber 10. Here, the reference refractive index $n_c$ for the effective index calculation is the average for inner annular cladding 32. The wavelength is 850 nm.

Core region 20 has a continuously varying positive effective refractive index $\Delta_1$ with a maximum $\Delta_{1MAX}$ at r=0 (i.e., at centerline 16). Outer annular cladding 36 has a substantially constant effective refractive index $\Delta_4$, and in an example embodiment $\Delta_4=\Delta_2=0\%$. Hole-containing region 34 has a depressed index $\Delta_3$.

In some embodiments, the inner annular cladding 32 has a relative refractive index $\Delta_2$ having a maximum value $\Delta_{2MAX} < 0.05\%$, and $-0.5\% < \Delta_{2MAX} < 0.05\%$. In an example embodiment, the effective refractive index $\Delta_3$ of hole-containing region 34 is the same as $\Delta_2$ at radius $R_2$ (i.e., $\Delta_2(R_2)=\Delta_3(R_2)$).

In some embodiments, the outer annular portion 36 has a relative refractive index $\Delta_4$ having a maximum value $\Delta_{4MAX} < 0.05\%$, while in other example embodiments, $-0.05\% < \Delta_{4MAX} < 0.05\%$. In an example embodiment, $\Delta_4(R_3) = \Delta_3(R_3)$.

In some embodiments, the inner annular cladding region 32 comprises pure silica. In some embodiments, outer annular cladding region 36 comprises pure silica. In some embodiments, the depressed-index hole-containing region 34 comprises pure silica with a plurality of voids 40. Preferably, the minimum relative refractive index, or average effective relative refractive index $\Delta_3$, such as taking into account the presence of any voids, of the depressed-index annular portion 34 preferably satisfies $\Delta_3 < -0.1\%$. In example embodiments, voids 40 contain one or more gases, such as argon, nitrogen, or oxygen, or the voids contain a vacuum with substantially no gas; regardless of the presence or absence of any gas, the effective refractive index $\Delta_3$ in the annular portion 34 is lowered due to the presence of voids 40.

As discussed above, voids 40 can be randomly or non-periodically disposed in nanostructured region 34 of cladding 30, and in other embodiments, the voids are disposed periodically. In some embodiments, the plurality of voids 40 comprises a plurality of non-periodically disposed voids and a plurality of periodically disposed voids. Alternatively, or in addition, the depressed index of nanostructured region 34 can also be provided by downdoping this region (such as with fluorine) or updoping one or more of the cladding regions 32 and 36 and/or the core 20, wherein nanostructured region 34 is, for example, pure silica or silica that is not doped as heavily as the inner annular cladding region 32.

Preferably, radius $R_1 > 4$ μm. In some embodiments, the minimum relative refractive index $\Delta_{3MIN} < -0.10\%$; in other embodiments, $\Delta_{3MIN} < -0.20\%$; in still other embodiments, $\Delta_{3MIN} < -0.30\%$; in yet other embodiments, $\Delta_{3MIN} < -0.40\%$.

In an example embodiment, $\Delta 1_{MAX} \leq 2.0\%$, more preferably $\Delta 1_{MAX} < 1.0\%$, even more preferably $\Delta 1_{MAX} < 1.0\%$, and still more preferably $\Delta 1_{MAX} \leq 0.8\%$; in some embodiments $0.4\% \leq \Delta 1_{MAX} \leq 1.0\%$, and in other embodiments $0.5\% \leq \Delta 1_{MAX} \leq 0.75\%$.

Figure 4:
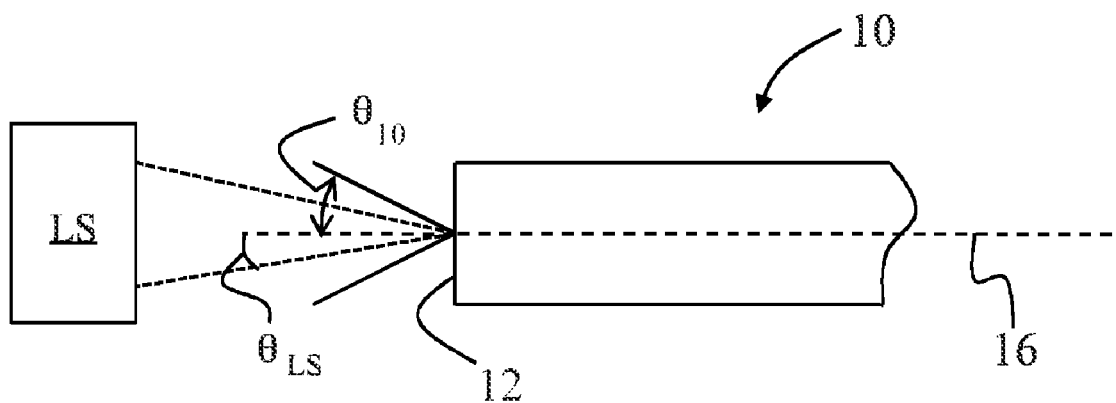
FIG. 4 is a close-up view of an end of a nanostructured fiber coupled to a light source, with the numerical aperture (NA) of the optical fiber being greater than that of the light source.

In an example embodiment, the numerical aperture (NA) of optical fiber 10 is given by $NA_{10} = n \sin \theta_{10}$ and is preferably greater than the numerical aperture $NA_{LS} = n \sin \theta_{LS}$ of an optical light source LS optically coupled to an end 12 of nanostructured fiber 10, as shown schematically in FIG. 4. For example, the $NA_{10}$ of fiber 10 is preferably greater than the NA of a vertical-cavity surface-emitting laser (VCSEL) source.

Multimode nanostructured fibers 10 are discussed in U.S. patent application Ser. No. 12/004174, entitled "Bend-resistant multimode optical fiber," filed on Dec. 20, 2007, and incorporated by reference herein. The bandwidth of the multi-mode version of nanostructured fiber 10 varies inversely with the square of $\Delta_{1MAX}$. For example, a multi-mode optical fiber 10 with $\Delta_{1MAX}=0.5\%$ can yield a bandwidth 16 times greater than an otherwise identical multi-mode optical fiber 10 with $\Delta 1_{MAX}=2.0\%$. For example, using the designs disclosed herein, fibers can be made which provide (a) a bandwidth of greater than 750 MHz-km, more preferably greater than 1.0 GHz-km, and even more preferably greater than 2.0 GHz-km, and most preferably greater than 3.0 GHz-km at a wavelength of 850 nm. These high bandwidths can be achieved while still maintaining a 1-turn 10 mm diameter mandrel wrap attenuation increase at a wavelength of 1550 nm, of less than 0.5 dB, more preferably less than 0.3 dB, and most preferably less than 0.2 dB. Similarly, these high bandwidths which exhibit such impressive bend performance at 1550 nm can also maintain a 1-turn 10 mm diameter mandrel wrap attenuation increase at a wavelength of 850 nm of less than 1.5 dB, more preferably less than 1.0 dB, and most preferably less than 0.62 dB. Such fibers can also exhibit a 1-turn 10 mm diameter mandrel wrap attenuation increase at a wavelength of 1550 nm, in dB, of less than or equal to the product of two times $(1/\Delta_{1MAX})^2$.

In some embodiments, 12.5 μm$\leq R_1 \leq 40$ μm, i.e. the diameter $2R_1$ of core 20 is between about 25 and 80 μm. In other embodiments, $R_1 > 20$ microns. In still other embodiments, $R_1 >$ microns. In yet other embodiments, $R_1 > 24$ microns.

Figure 5:
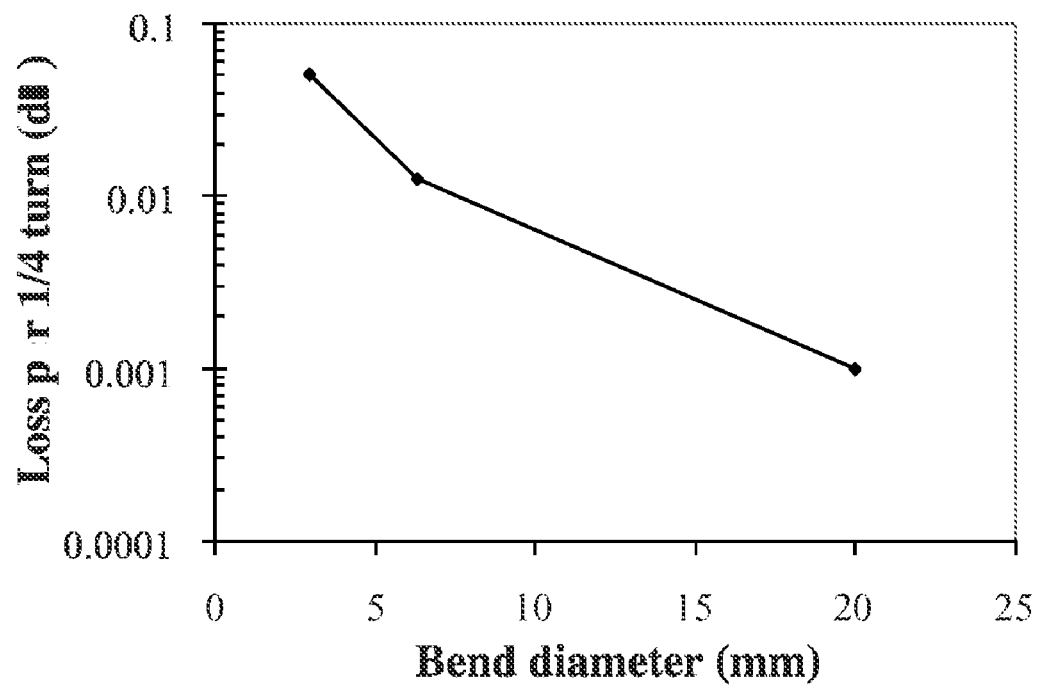
FIG. 5 is a plot of the "loss per quarter turn" (dB) vs. bend radius (mm) for an example nanostructured optical fiber.

FIG. 5 is a plot of the loss (dB) vs. bend radius for an example nanostructured optical fiber 10 subjected to a ¼ (i.e., 90°) turn, which is representative of one example of the degree of turn used in the bent optical fiber coupler 100 discussed in greater detail below. The optical loss associated with a ¼ turn was determined using mandrels of different diameters. The plot of FIG. 5 shows that relatively low losses (<1.0 dB) can be achieved using diameters far smaller than 25 mm, and as small as about 3 mm. This amount of loss as a function of bend is rather small.

A concern relating to fibers with small bend radii is stress-induced failure over time. Data for failure probability per turn over a 25-year lifetime as a function of bend radius is provided in Table 1.1 for standard 125 µm outer-diameter (OD) optical fiber. The table shows that a sharp increase in probability of failure/turn increases as the bend radius is reduced from 7.5 mm to 5 mm. It is known that the failure probability/turn should be reduced using smaller OD optical fiber (e.g., 80 µm OD).

TABLE 1.1

Failure probability/turn over a 25-year lifetime for 125 µm OD fiber

| Radius (mm) | Probability of failure/turn (ppm) |
| --- | --- |
| 5.0 | 3 |
| 7.5 | 1 |
| 10 | 0.5 |
| 15 | 0.1 |

Recent experiments have shown that localized $CO_2$ laser heating of optical fibers can anneal out bend stresses at moderate temperatures (for example, about 600° C.). These temperatures are high compared to polymer treatments but low compared to the softening and strain points of silica materials. While this process tends to significantly weaken the optical fiber, it can also be used to form optical fiber bends having bend radii much lower than 5.0 mm with a low probability of failure/turn.

Optical Fiber Coupler

Figure 6:
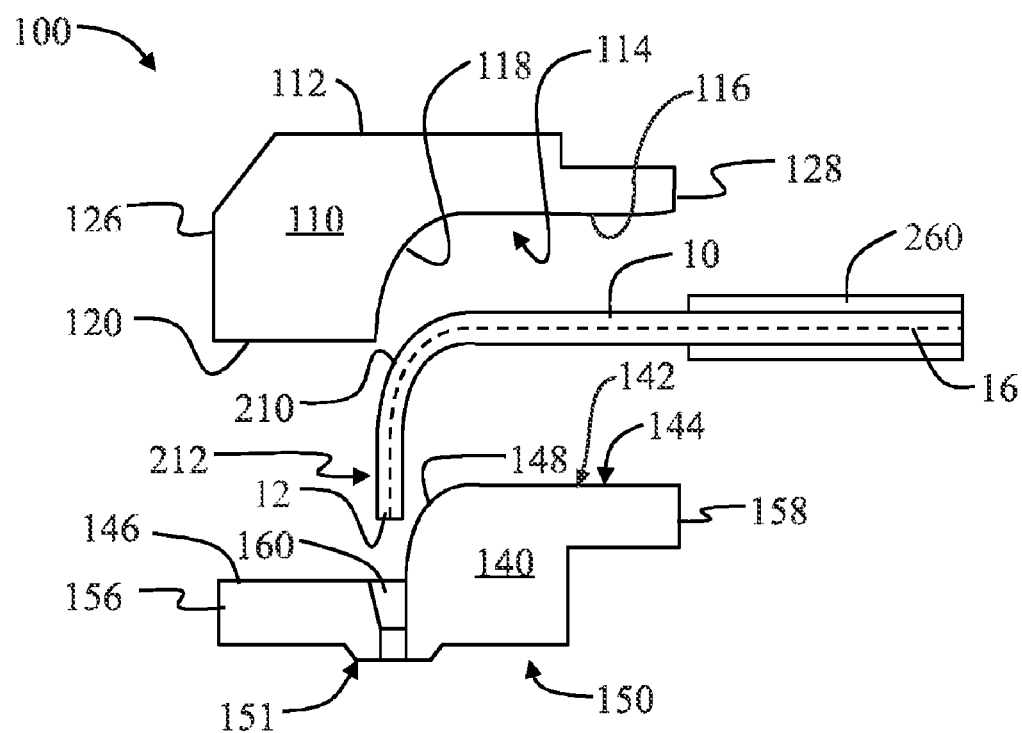
FIG. 6 is a schematic cross-sectional exploded view of an example optical fiber coupler according to the present invention that employs upper and lower alignment members and one or more nanostructured optical fibers.

FIG. 6 is a schematic cross-sectional exploded view of an example bent optical fiber coupler ("coupler") 100 that employs one or more optical fibers 10 (for example, nanostructured optical fibers or other types of optical fibers having low bend loss performance, for example, hereinafter, all simply referred to as "fiber 10" for the sake of simplicity of description). In an example embodiment, coupler 100 includes an upper alignment member 110 having top surface 112, an "inner" surface 114 that includes a flat portion 116 and a concave curved surface 118. In an example embodiment, concave curved surface 118 comprises a quarter-round curve. Upper alignment member 110 also has a flat bottom surface 120 and front and back ends 126 and 128. In an example embodiment, upper alignment member 110 comprises a pre-formed substrate.

Coupler 100 also includes a lower alignment member 140 having a top surface 142 with flat portions 144 and 146 and a convex curved surface 148, a bottom surface 150 and front and back ends 156 and 158. In an example embodiment, convex curved surface 148 comprises a quarter-round curve. In an example embodiment, lower alignment member 140 comprises a pre-formed substrate.

Lower alignment member 140 also includes an optical fiber guide channel (or "fiber guide") 160 located where the flat portion 146 and curved surface 148 meet. Fiber guide 160 is configured to accommodate one or more optical fibers 10. In an example embodiment, fiber guide 160 includes one or more tapered through-holes that facilitate insertion of fiber(s) 10.

Figure 7:
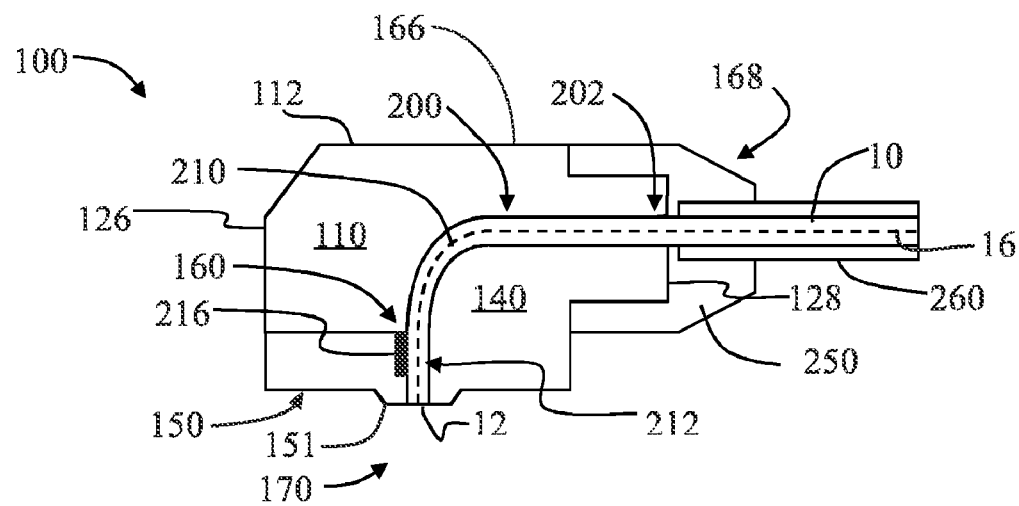
FIG. 7 is similar to FIG. 6, but is an unexploded cross-sectional view and also includes a strain-relief element at one of the input/output (I/O) ends.

With reference now to FIG. 7, upper and lower alignment members 110 and 140 are brought together to form a coupler body 166 having first and second input/output (I/O) ends 168 and 170 that lie in generally orthogonal planes. In forming coupler body 166, flat surface portions 120 and 146 of the upper and lower alignment members 110 and 140 come into contact, and respective curved surfaces 118 and 148 are adjacently disposed to define a curved optical fiber guide channel ("fiber guide") 200. Fiber guide 200 has a first end 202 at first I/O end 168. In an example embodiment, curved fiber guide 200 defines a right-angle curve (e.g., quarter-round curve) having central bend radius RC.

Figure 8:
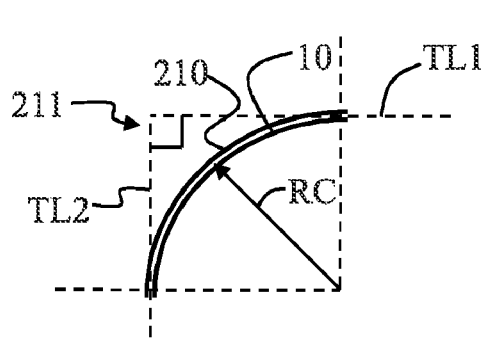
FIG. 8 is a schematic side view of a nanostructured optical fiber illustrating the concept of a right-angle curve in the form of a quarter-round bend in the fiber.

Generally, curved fiber guide 200 defines a relatively strong bend in fiber 10, such as from between 45° to 135°. FIG. 8 is a schematic side view of an optical fiber 10 illustrating the concept of a "substantially right-angled bend" in the form of a quarter-round bend 210 in the fiber. Generally, a "substantially right-angled bend" is any bend wherein two tangent lines TL1 and TL2 to the curve intersect to form angle 211 at or close to a right angle (e.g., within +/−5° of 90°). In a preferred embodiment, concave and convex curved surfaces 118 and 148 are configured to form a substantially right-angled bend 210 in fiber 10, and in an example embodiment are quarter-round curves, i.e., ¼ of the circumference of a circle. In general, bend angle 211 of bend 210 can range from 45° to 135°, with an exemplary "substantially right-angled bend" being in the range from 85° to 95°. Coupler 100 is shown as being configured to form a right-angle bend in fiber 10 for ease of illustration.

Coupler 100 may include one or more nanostructured optical fibers (or other types of optical fiber, including bend performance optical fibers, for example, hereinafter, all simply referred to as "fiber 10" in some instances for the sake of simplicity of description) disposed between upper and lower alignment members 110 and 140 within curved fiber guide 200. This causes fiber 10 to have corresponding bend 210 that corresponds to central bend radius RC. Fiber 10 has an end portion 212 associated with fiber end face 12. Fiber end portion 212 is contained within fiber guide 160 and is preferably held therein with adhesive 216. In an example embodiment, fiber end face 12 is flush with bottom surface 150 of lower alignment member 140.

Fiber 10 can be single mode or multimode. Fiber cladding diameters can be, for example, the standard diameter (125 µm) or a reduced diameter (80 µm) to simplify fiber routing and increase the number of fibers per unit area at the coupler interface. However, any suitable diameter for the fiber cladding may be used.

In an example embodiment, fiber bend 210 is formed during assembly of coupler 100, e.g., by bending fiber 10 over curved surface portion 148 of lower alignment member 140 and then placing and securing upper alignment member 110 atop the lower alignment member so that fiber 10 is held in curved fiber guide 200. In an example embodiment, grooves or other control features (not shown) form one or both curved surface portions 118 and 148 to facilitate aligning and controlling the bending of fiber 10 within fiber guide 160.

In an example embodiment, fiber guide 160 provides a tight fit to fiber 10 so that the fiber is firmly held therein. In an example embodiment, fiber guide 160 provides a no-slip or frictional fit to fiber 10. In another example embodiment, adhesive or epoxy is used to establish the tight fit within fiber guide 160.

In an example embodiment, bend radius RC is in the range defined by 1 mm≦RC≦15 mm, while in another example embodiment is within in the range defined by 5 mm≦RC≦15 mm, and in another example embodiment is within the range defined by 2 mm≦RC≦3 mm. In another example embodiment, bend radius RC is that which provides an attenuation of no greater than 0.1 dB. In another example embodiment, bend radius RC is selected to ensure a high reliability (e.g., less than 100 FIT) over the life of the product.

In an example embodiment, alignment of fiber 10 is accomplished by overmolding an additional element (not shown) within the lower fiber alignment member. Such elements include small Si V-groove substrates or other parts with precision slots, grooves, holes or the like.

With continuing reference to FIG. 7, after the upper and lower fiber alignment members 110 and 140 are joined together to contain bent fiber 10 in fiber guide 200, a strain relief element 250 is attached to coupler body 166 at first I/O end 168. This is to prevent coupler damage in the case of excessive axial or side-pull loading on fiber 10, which in an example embodiment is encased in a fiber jacket 260 that terminates within strain relief element 250.

Figure 9:
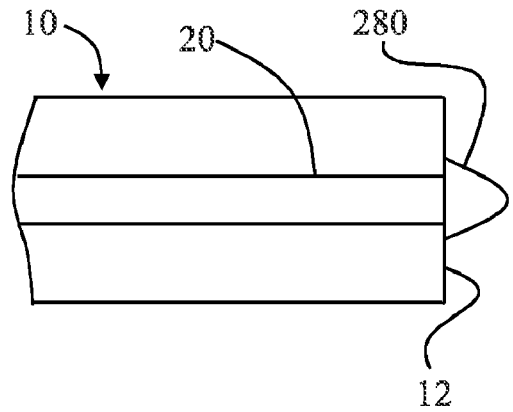
FIG. 9 is a cross-sectional view of an end portion of a nanostructured optical fiber with a lens arranged at the fiber end face.
Figure 10:
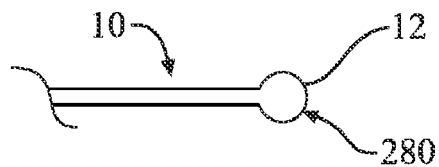
FIG. 10 is a cross-sectional view an end portion of a nanostructured optical fiber having a bulbous fiber end face that serves as a lens.

In an example embodiment, fiber end face 12 is polished and/or is anti-reflection coated as needed. In another example embodiment as illustrated in FIGS. 9 and 10, a microlens 280 is formed on or at fiber end face 12. In FIG. 9, a microlens 280 such as a gradient-index lens is added to fiber end face 12, while in FIG. 10, microlens 280 is formed at the fiber end face using, e.g., laser heating or selective wet-etch techniques. Coupling losses as low as 0.4 dB to high numerical aperture (NA) laser beams have been demonstrated using this approach. Working distances can be adjusted over an 8-50 micron range, and the design of microlens 280 can be made significantly independent of a particular multimode graded index optical profile of the particular type of fiber 10 used.

The two-piece structure of coupler 100 includes a number of advantages. Concave and convex surfaces 118 and 148 serve to control the curvature of fiber 10 as and/or after the upper and lower alignment members 110 and 140 are assembled. These surfaces also ensure adequate support for fiber 10 or its protective cover material, and ensure that the protective cover material has adequate cohesion. Further, concave and convex surfaces 118 and 148 may constrain a benign failure in the fiber 10 itself.

Opto-Electronic Assembly

Figure 11:
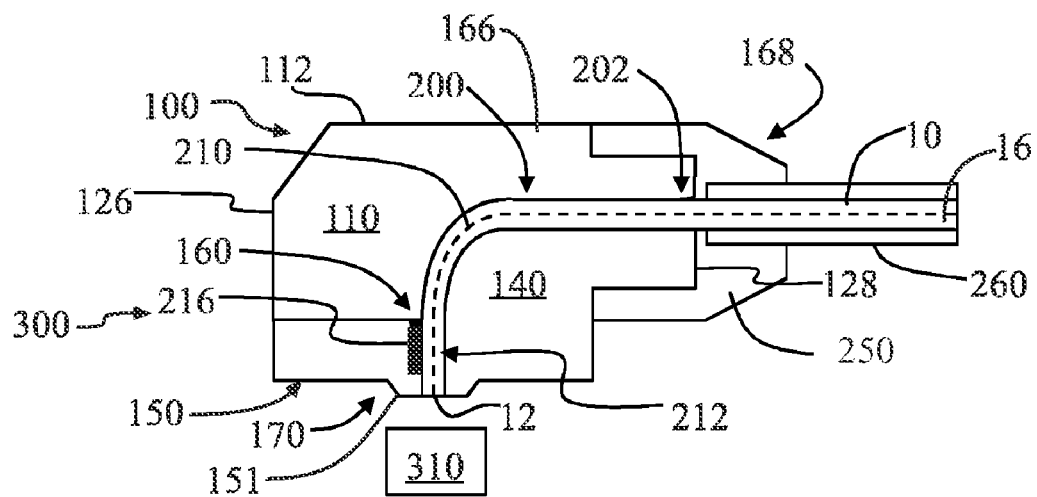
FIG. 11 is a schematic diagram of an opto-electronic assembly that includes the optical fiber coupler of the present invention optically coupled to an opto-electronic device.

FIG. 11 is a schematic diagram of an opto-electronic assembly 300 that includes coupler 100 as discussed above. Opto-electronic assembly 300 includes an opto-electronic device 310, such as an optical transmitter (e.g., an optical transmitter array, broad-area emitter, etc.) or an optical detector (e.g., an optical detector array, broad-area detector, vertical-cavity surface-emitting laser (VCSEL), LED, etc.). In an example embodiment, fiber 10 is directly optically coupled at end face 12 to opto-electronic device 310 without intermediate coupling optics.

In another example embodiment, microlens 280 (see FIGS. 9 and 10) is used to facilitate optical coupling to opto-electronic device 310. Microlens 280 can be configured to allow for increasing the separation between coupler 100 and opto-electronic device 310. Fiber end face 12 can be positioned within fiber guide 160 so that micro lens 280 is flush with bottom 150. Alternatively, microlens 280 and/or fiber end face 12 (with and without a microlens thereat) can be allowed to protrude from fiber guide 160.

In an example embodiment, the bottom surface 150 of lower alignment member 140 includes a projection 151 at second I/O end 170. In an example embodiment, projection 151 is sufficiently narrow to allow the fiber end face 12 to be positioned in close proximity to opto-electronic device 310 without interfering with other items or components, such as wire bonds in the opto-electronic device.

In an example embodiment mentioned above, opto-electronic device 310 includes a broad area optical detector, which like a VCSEL, is commonly implemented using planar fabrication processes. Also like a VCSEL, the detector active area can be optimized to provide low-loss fiber-to-detector coupling as well as high device data rates. The planar process enables 1D or 2D layouts and co-location of detector amplification circuitry for high-speed device operation.

Typical opto-electronic devices 310 are packaged using well-established packaging techniques. For example, device substrates are commonly used, with the substrate arranged parallel to the package mounting surface (e.g., a printed circuit board). This configuration is desirable for efficient thermal management of the opto-electronic component, and it also enables standard low-cost electrical interconnection methods (e.g., wire bonding). In the case of optical devices, the configuration also enables relatively simple testing prior to final assembly. Examples of such packing are discussed below.

Figure 12:
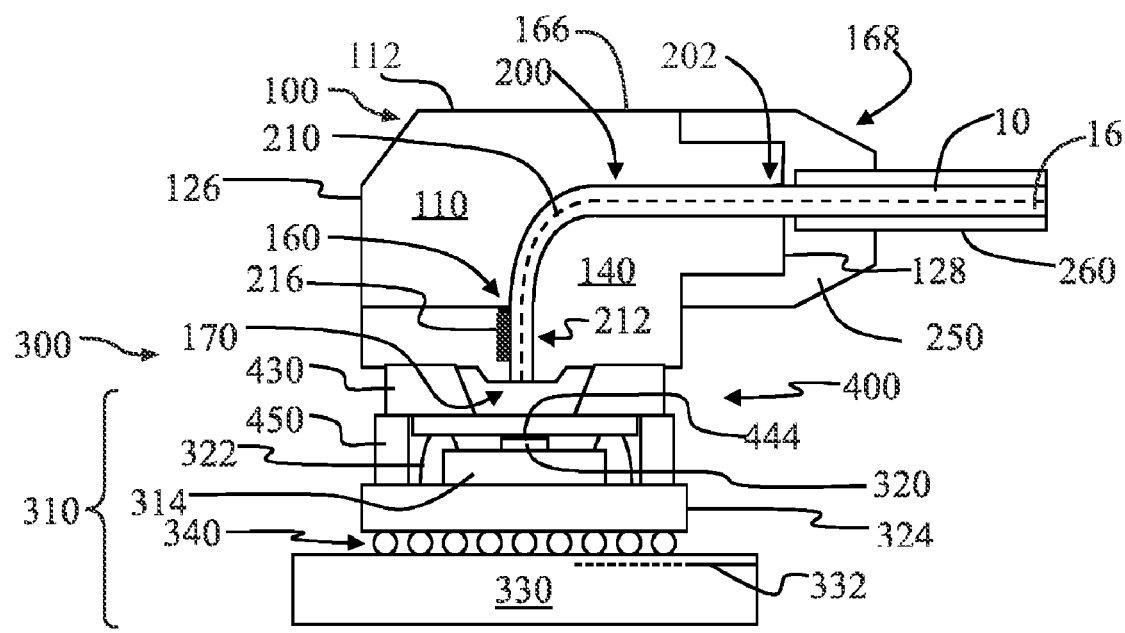
FIG. 12 is similar to FIG. 11 and includes an example opto-electronic device in the form of a VSCEL assembly.

FIG. 12 is similar to FIG. 11 and shows an example opto-electronic device 310 that includes at least one active element 320. In an example embodiment, opto-electronic device is in the form of a VSCEL assembly (also referred to as 310) that includes a VCSEL device (also referred to as 320) used as, for example, a data transmitter. VCSELS are well-suited for low-loss coupling into both multi-mode fibers and polymer waveguides. The emission area of a VCSEL can be modified to maximize beam overlap with a multi-mode fiber or other waveguide while also balancing other requirements such as maximum data rate and power dissipation. The planar fabrication process enables dense VCSEL layouts in 1-dimensional (1D) or 2-dimensional (2D) arrays and co-location of laser drive circuitry for high-performance operation.

VCSEL assembly 310 includes a VCSEL substrate 314 that operably supports VCSEL device 320. VCSEL substrate 314 is supported by a package substrate 324 that includes electrical structure including electrical vias (not shown). A printed circuit board 330 with electrical wiring 332 is connected to package substrate and electrical vias (not shown) via a ball grid array 340. An alignment structure 400 is used in an example embodiment to align and otherwise operably couple coupler 100 to VCSEL assembly 310.

Figure 13:
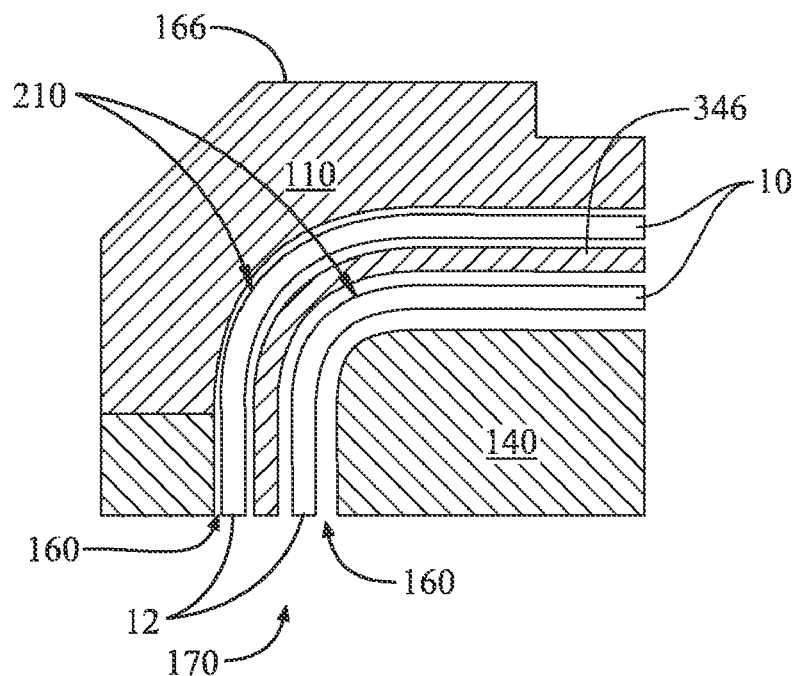
FIG. 13 is a close-up view of an example coupler that includes a divider member arranged between the concave and convex surfaces of the upper and lower alignment members so define multiple guide channels that support at least one optical fiber.

It is noted here that the cross-sectional views of coupler 100 presented herein depict a 1-dimensional array of one or more fibers 10 by way of illustration. Two-dimensional arrays are also contemplated by the present invention. With reference to FIG. 13, such embodiments may be formed, for example, by providing at least one alignment member and/or spacer ("divider member") 346 to offset each 1-D row of fibers 10 from neighboring rows. Lower alignment member 140 includes multiple fiber guides 160 to accommodate the multiple rows of fibers 10. The 2-D array pattern may include non-regular fiber waveguide pitches or 2-D patterns with some amount of skew to maximize optical coupling with the opto-electronic device 310.

Figure 14:
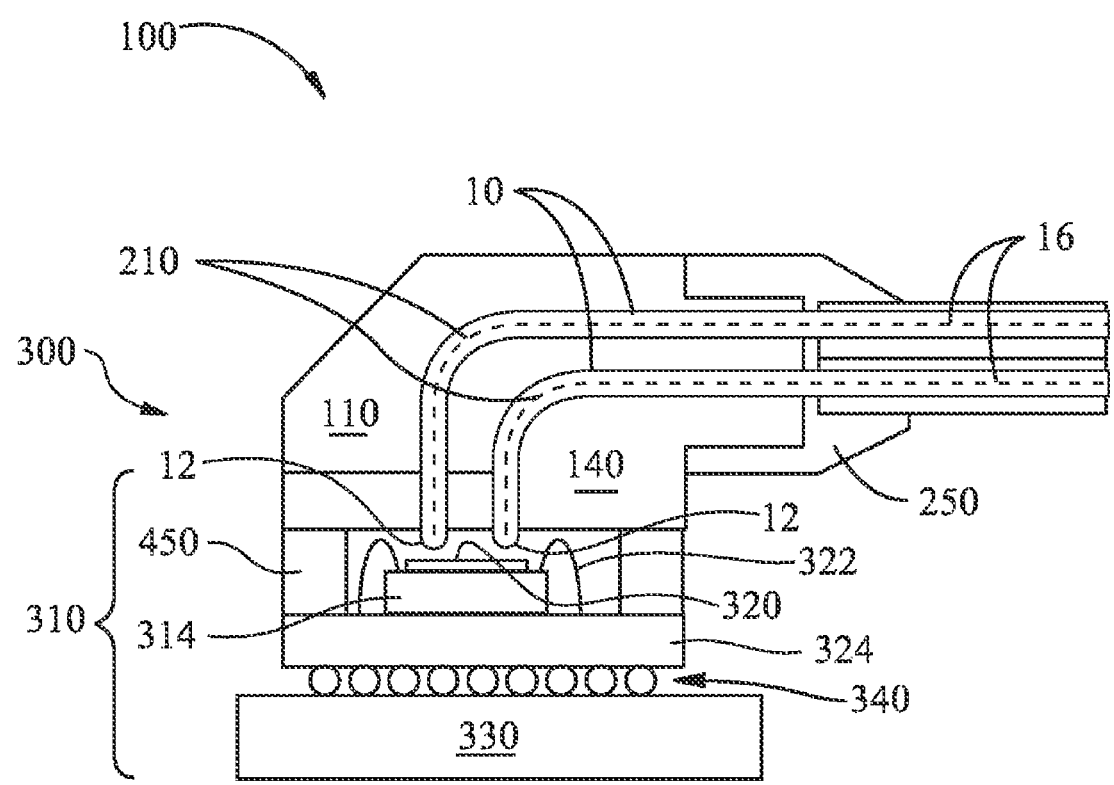
FIG. 14 is a schematic diagram of an opto-electronic assembly similar that of FIG. 12, but illustrating an example embodiment that utilizes a coupler having a coupler body according to FIG. 13 that accommodates multiple optical fibers.

FIG. 14 is a schematic diagram of opto-electronic assembly 300 similar that of FIG. 12, but illustrating an example embodiment that utilizes a coupler 100 having a coupler body 166 according to FIG. 13 that accommodates multiple fibers 10 optically coupled to respective active elements (e.g., VCSEL devices) 320. This embodiment increases the number of optical interconnections provided by coupler 10 without dramatically increasing the size of the coupler or the opto-electronic package.

Various factors influence the spacing of active elements 320 on opto-electrical device 310, including adequate power dissipation and real estate requirements for associated support electronics. In general, it is desirable to increase the spacing between active elements 320 while keeping the optical array pitch small. In one example embodiment, if many fibers 10 are stacked together, a pitch conversion structure (not shown) is used so that active devices 320 can be spaced at a relatively large pitch. The fiber array pitch is set by fiber guides, such as fiber guides 160, formed integral with lower alignment member 140.

Figure 15:
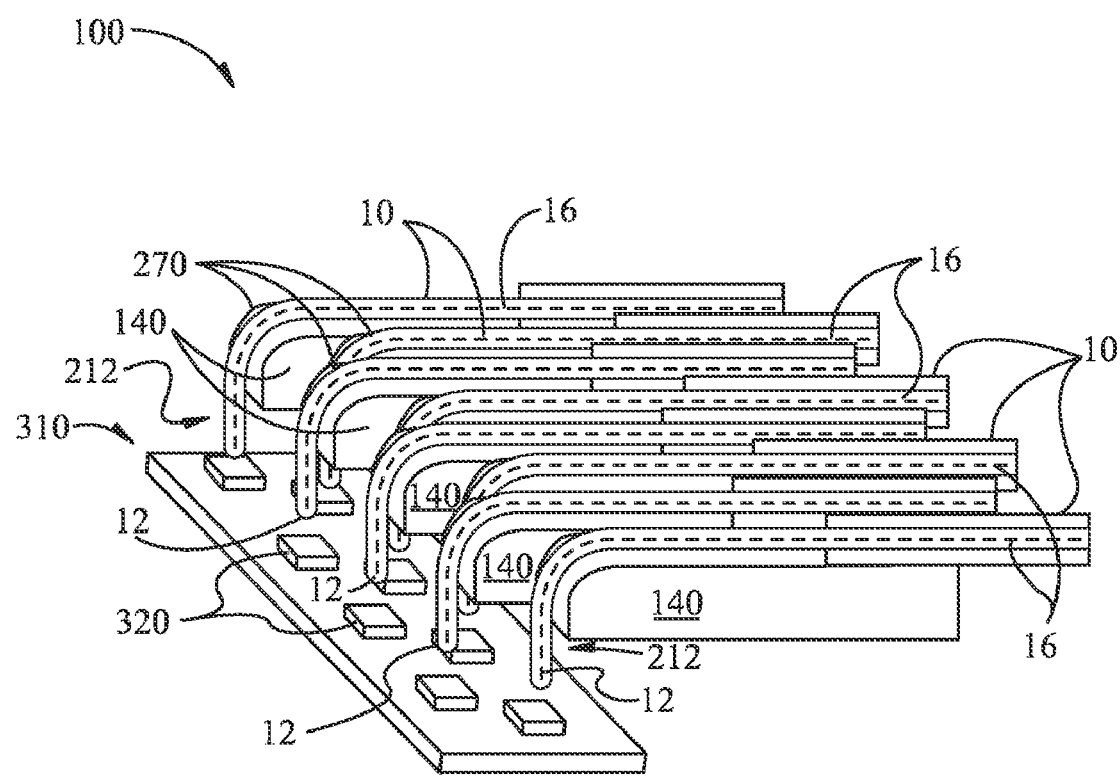
FIG. 15 is a perspective view of an example embodiment of the coupler of the present invention having staggered lower alignment members that allows for a reduced minimum spacing between active devices.

FIG. 15 is a perspective view of an example embodiment of the lower portion of coupler 100 illustrating an arrangement that allows the minimum spacing between active devices 320 to be reduced (i.e., to be even smaller). Upper alignment member 110 is not shown for the sake of simplicity in illustration only. In coupler 100 of FIG. 15, the positions of fiber bends 210 are staggered along a one-dimensional array of fibers 10 using a plurality of staggered lower alignment members 140. The lengths of the staggered lower alignment members 140 that support fibers 10 and bends 210 can be varied so that the fiber pitch is half the minimum distance between active devices 320. In this case, the length difference between lower alignment members 140 is $\sqrt{3}$ times the fiber array pitch.

The staggered configuration of lower alignment members 140 and fibers 10 results in corresponding staggered location of fiber end faces 12. The staggered configuration of FIG. 15 is desirable in cases where small-diameter (e.g., 80 μm) fibers 10 are used to improve long-term mechanical reliability of fiber bends 210. For example, if a 40 μm thick coating 50 is applied to an 80 μm diameter fiber, the resulting fiber can be ribbonized at a pitch of ~160 μm. By employing a length difference between lower alignment members 140 of $\sqrt{3} \times 160$ μm=277 μm, the minimum spacing between active devices 320 can be set to 320 μm.

Other staggered configurations can be similarly formed, such as where three or more different lower alignment member lengths are employed to further separate active devices 320. Upper alignment members 110 (not shown in FIG. 15) are formed so as to conform to the particular staggered geometry of lower alignment members 140.

Coupler Fabrication Methods

Figure 16:
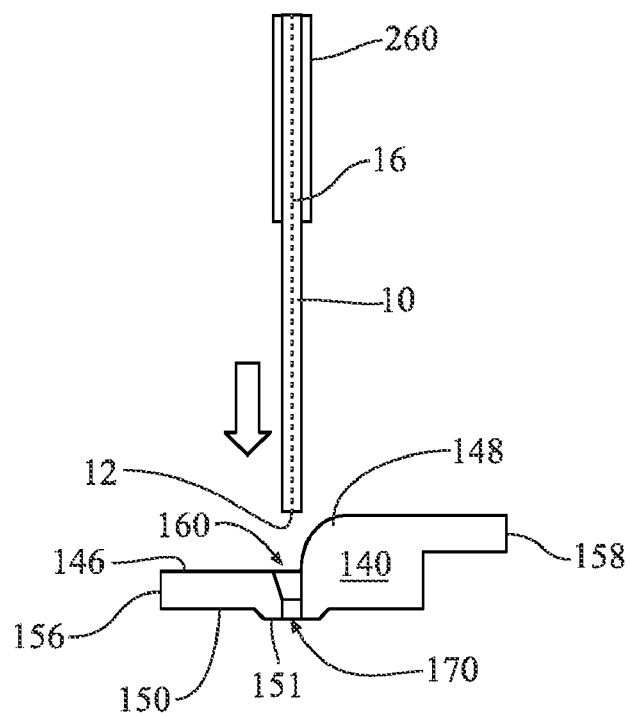
FIG. 16 illustrates an example embodiment of the coupler in the process of being fabricated, showing lower alignment member and an unbent nanostructured fiber positioned to have its end portion inserted into the fiber guide in the lower alignment member.
Figure 17:
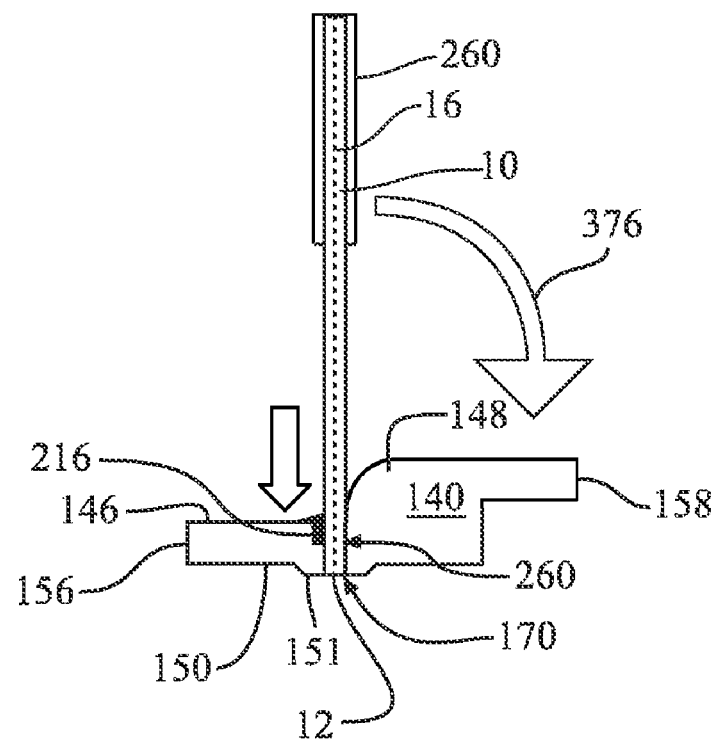
FIG. 17 shows the next step in the example fabrication process wherein the fiber has its end portion inserted into lower alignment member fiber guide with the fiber extending vertically therefrom.

FIG. 16 illustrates an example embodiment of coupler 100 in the process of being fabricated, showing lower alignment member 140 and a yet unbent fiber 10 positioned to have its end portion 12 inserted into fiber guide 160. In FIG. 17, fiber 10 has its end portion 12 inserted into fiber guide 160 and the fiber extends vertically therefrom. An adhesive 216 (e.g., an ultra-violet (UV) curable adhesive) is used to secure fiber 10 within fiber guide 160.

Figure 18:
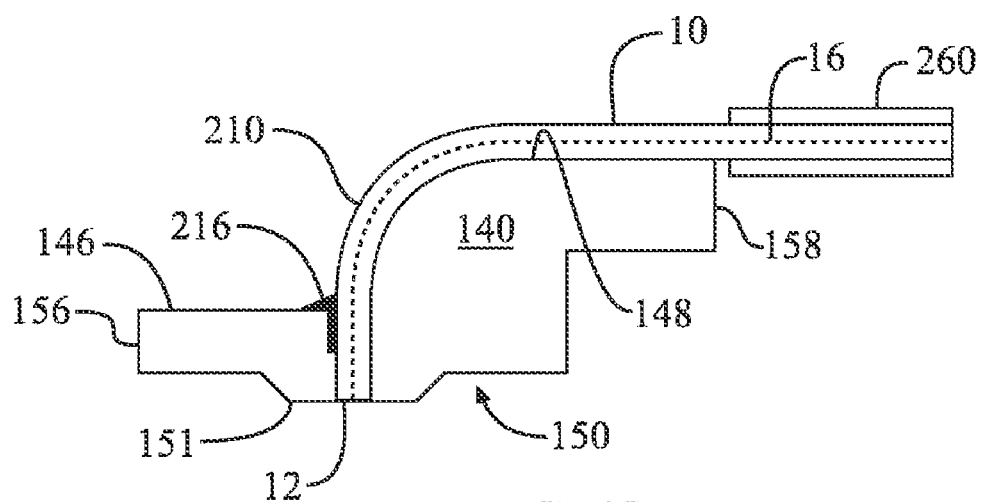
FIG. 18 shows the next step in the example fabrication process wherein the fiber is bent to conform to the convex surface portion of the lower alignment member.
Figure 19:
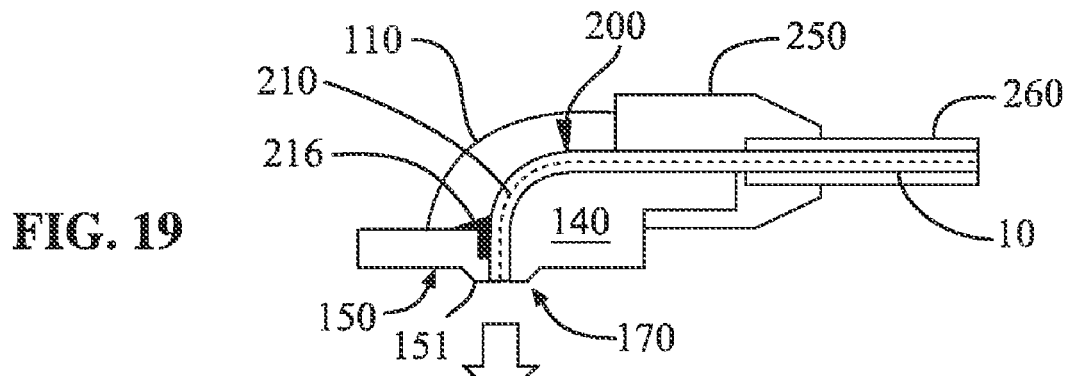
FIG. 19 shows the next step in the example fabrication process wherein the upper alignment member is in the form of a curable adhesive applied to the lower alignment member and nanostructured fiber thereon so as to form the coupler body.

FIG. 18 shows fiber 10 after it is bent (see arrow 376 of FIG. 17) so as to be positioned along curved surface 148 of lower alignment member 140. With reference to FIG. 19, an adhesive (e.g., a UV-curable adhesive) is applied to lower alignment member 140 and fiber 10 supported thereby so as to form upper alignment member 110 and curved fiber guide 200. Strain relief element 250 is then optionally attached (e.g., using an adhesive) to a coupler body I/O end 168.

Figure 20:
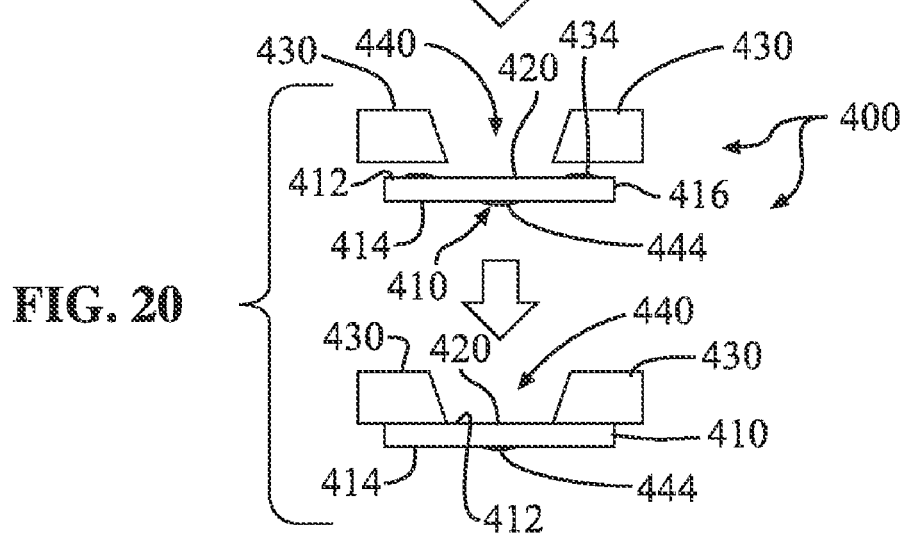
FIG. 20 shows a schematic exploded and assembled side views of an example embodiment of an alignment structure used to align the coupler with an opto-electronic device in an opto-electronic assembly.

FIG. 20 shows schematic exploded and assembled side views of an example embodiment of an alignment structure 400 used to align coupler 100 with opto-electronic device 310. Alignment structure 400 includes a substrate 410 having upper and lower surfaces 412 and 414 and a periphery 416. In an example embodiment, substrate 410 includes a transparent center portion (or alternatively, an aperture) 420. In an example embodiment, substrate 410 is made of glass. The alignment structure includes at least one alignment member (e.g., a cap) 430 arranged atop substrate upper surface 412 (e.g., via an adhesive 434) so as to form an opening 440 sized to receive coupler I/O end 170 and align fiber 10 therein with opto-electronic device 310. In an example embodiment, substrate center portion 420 is transparent and includes a lens 444 arranged thereon or thereat to facilitate optical coupling to opto-electronic device 310.

Figure 21:
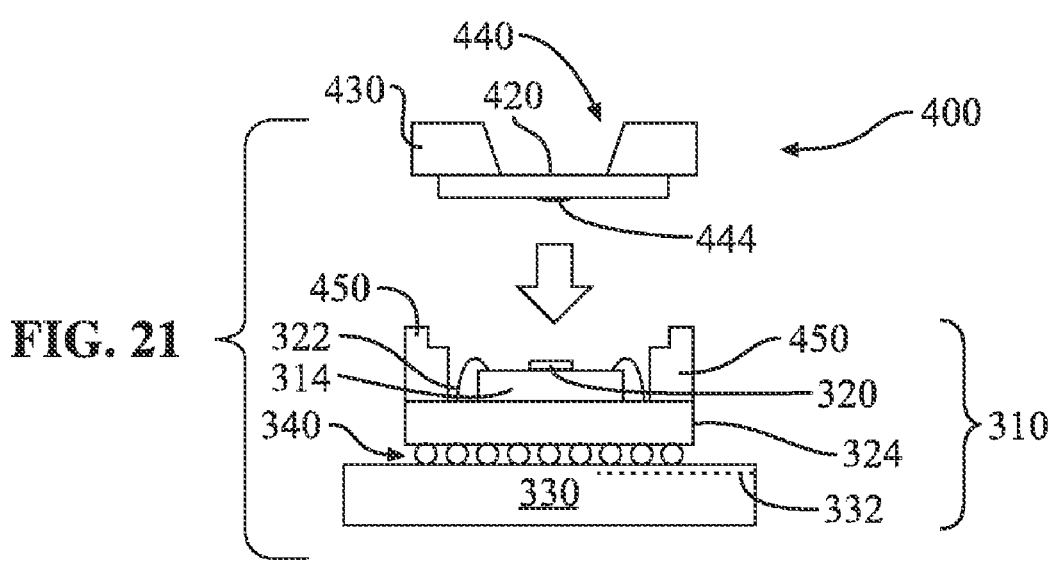
FIG. 21 shows an exploded view of the alignment structure of FIG. 20 and the opto-electronic device in the form of a VCSEL assembly.

FIG. 21 is an exploded view of alignment structure 400 and corresponding opto-electronic device 310 in the form of a VCSEL assembly. FIG. 12 discussed above shows alignment structure 400 in place on VCSEL assembly 310 and coupler 100 engaged with the alignment structure. In an example embodiment, alignment structure 400 is aligned and attached to opto-electronic device 310. The alignment process may be active or passive, depending on alignment tolerances. Note that in FIG. 21 alignment structure 400 is integrated with opto-electronic device 310 by way of support elements 450 connected to package substrate 324.

Alignment member 430 may be formed, for example, by bonding a preformed member onto substrate 410. The alignment member 430 can be a molded part or formed from a silicon substrate fabricated by through-wafer KOH etching. Lens 444 and substrate 410 can be formed via a laser bump process, a photoform processes, or via glass substrate hot press molding.

Once alignment structure 400 is properly arranged relative to opto-electronic device 310 (and if necessary, attached thereto), coupler 100 is aligned to the alignment structure and engaged therewith. Coupler 100 may be temporarily held in place via latching elements (not shown) or permanently held in place using thin layers of adhesive (not shown) in and/or around alignment member 430.

Annealing the Fiber Bend

In an example embodiment, fiber bend 210 is annealed prior to the final assembly of coupler 100 by laser annealing fiber 10. This approach reduces fiber stresses to ensure high reliability over the life of coupler 100.

In an example embodiment, stresses induced in bend 210 of fiber 10 are annealed out of the fiber by laser heating the fiber to a temperature less than that at the softening point of the fiber, for example about 600° C. The laser annealing processes can also heal defects on the fiber surface via thermally-induced silica migration. When laser annealing is carried out on fiber bend 210 in situ (i.e., after the fiber has been inserted into the fiber alignment structure), the laser beam is likely to induce local heating of the surrounding fiber support structure. This heating may result from direct absorption of laser radiation or indirectly via IR radiation from the heated fiber bend.

Typical filled organic materials used in low-cost injection molding of the upper and lower alignment members 110 and 140 may be damaged by laser annealing temperatures. It is therefore beneficial to protect coupler body 166 from the incident laser beam, and/or heat produced thereby, using a temporary or permanent shield structure.

Figure 22:
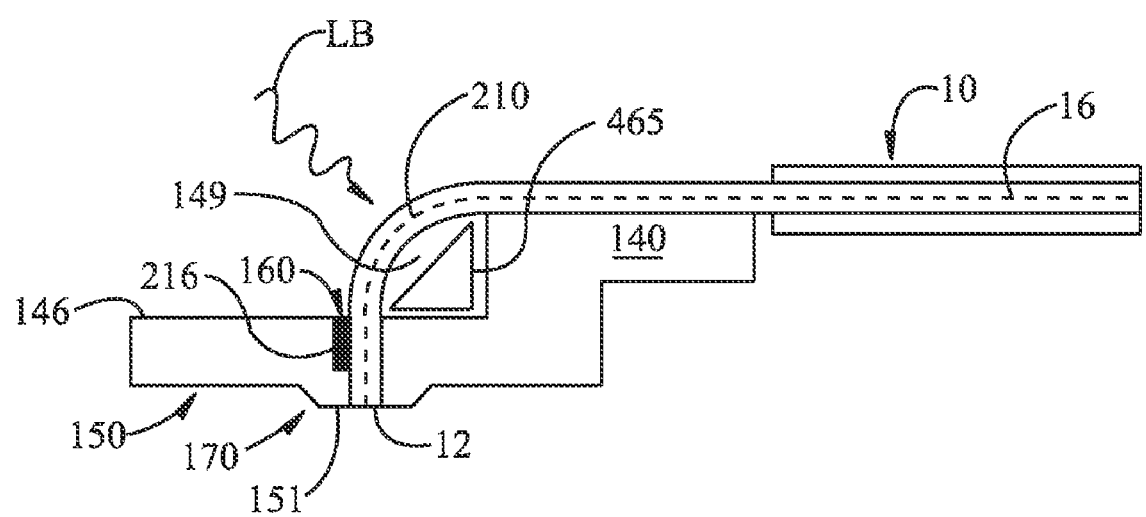
FIG. 22 is a schematic diagram similar to FIG. 18 that illustrates an example embodiment of a modified lower alignment member wherein the coupler includes a heat shield to facilitate laser processing of the fiber bend.
Figure 23:
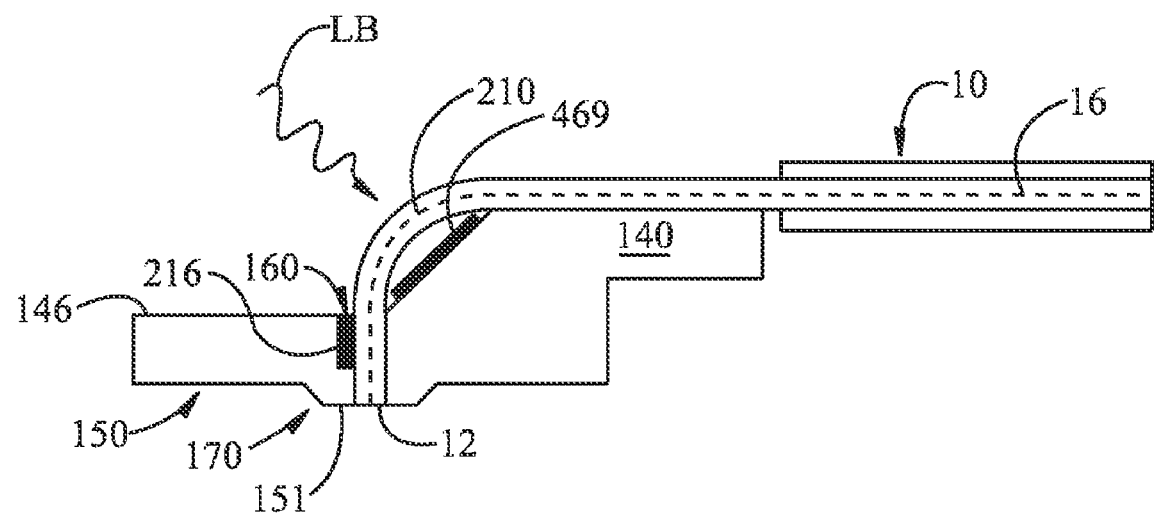
FIG. 23 is a schematic diagram similar to FIG. 22, illustrating an example embodiment of a heat shield in the form of a metallized angled surface formed on the lower alignment member.

FIG. 22 is a schematic diagram similar to FIG. 18 that illustrates an example embodiment of a modified lower alignment member 140 that includes heat shielding. In the embodiment shown in FIG. 22, fiber 10 is unsupported over most of bend 210. This configuration removes some or all of convex surface portion 148 (see FIG. 6) and opens up a space 149 behind the fiber bend. Bend 210 is then annealed by heating with a laser beam LB. A heat shield 465 is optionally inserted in space 149 to protect lower alignment member 140 from laser beam LB, and/or heat produce thereby, during laser heating. Heat shield 465 may be temporarily arranged in space 149, or may also be integrated into lower alignment member 140 by metalizing an angled surface 469 directly behind fiber bend 210, as illustrated in FIG. 23. Alternatively, the heat shield 465 and/or surface 469 may be formed so as to produce a convex curved surface, having a profile the same as or similar to that of convex portion 148, for supporting the fiber 10 in the same manner as does the convex surface 148 of the other embodiments described herein. In the case of metalizing, convex surface 148 itself could be metallized.

In situ annealing of fiber bend 210 makes for easier assembly of coupler 100 while also improving coupler reliability. Annealing an optical fiber tends to make the fiber more brittle. In situ annealing of fiber 10 means that a brittle annealed fiber does not need to be manipulated during the assembly process, thereby facilitating assembly while also reducing the risk of breaking or damaging the fiber.

In one example embodiment, annealing of fiber 10 is accomplished by bending fiber 10 into the desired bent position and applying heat to the fiber. In another example embodiment, incremental (stepwise) bends are formed and each bend is heated along the way to forming the final bend 210. The heating can be provided in short laser pulses. Incremental bending and heating allows for the fiber to cool, which allows for managing the thermal profile during the annealing process.

Integrated Fiber Bend Photodetector

When an optical fiber is bent, at least some of the light guided by the core is coupled into the fiber cladding. Most fiber applications involve bend radii that are large enough to minimize bend loss affects. In the bent fiber array coupler described herein, the optical fiber is bent through a small radius so that the amount of light coupled into the cladding 30 may be non-negligible (e.g., 0.1-0.3 dB). Since optical links for high performance links are generally short (<100 m) this amount of light loss is likely acceptable.

Figure 24:
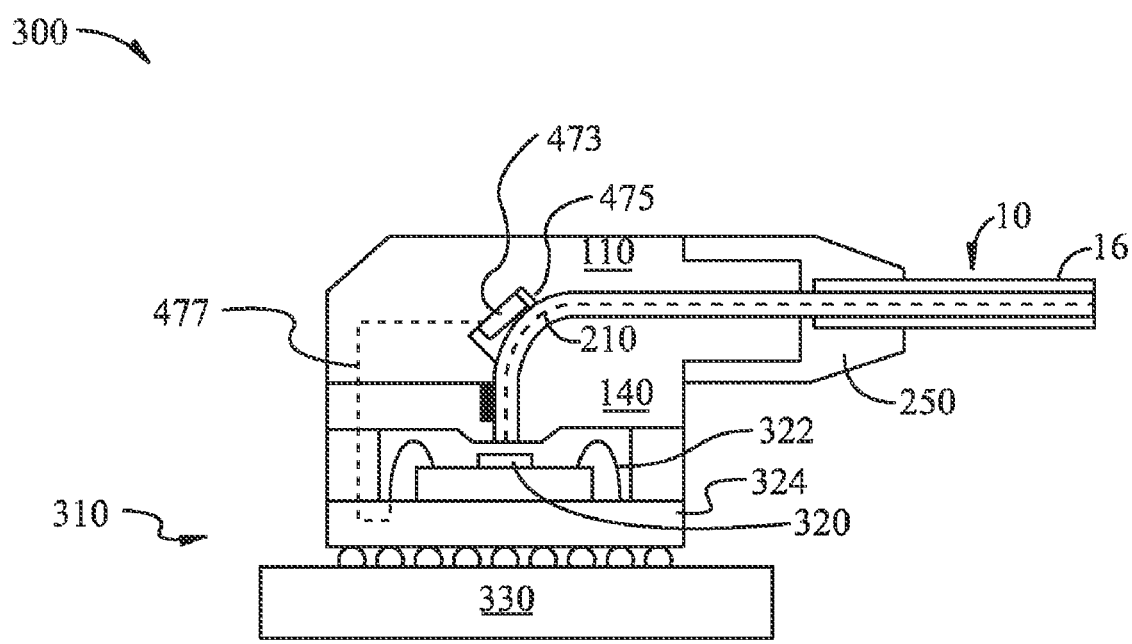
FIG. 24 is a schematic diagram similar to FIG. 12 and illustrates an example embodiment of a coupler that includes an optical detector positioned to detect light on an outer side of the fiber bend.

Light coupled into the fiber cladding 30 at a fiber bend 210 can continue through the fiber-air interface and exit the fiber. FIG. 24 is a schematic diagram similar to FIG. 12 and illustrates an example embodiment of coupler 10 that includes an optical detector 473 positioned adjacent the outside of fiber bend 210 so as to detect light that "leaks" from the bend. This light is then monitored over time to assess the ongoing performance of coupler 100.

In an example embodiment, detector 473 is disposed in a cavity 475 formed in upper alignment member 110 and is adjacent to concave surface portion 118. Electrical interconnections 477 for detector 473 are shown being routed through bottom alignment member 100 and to control circuitry (not shown) located near VCSEL device 320 within the opto-electronic device 310. In an example embodiment, optical detector 473 is a photodiode.

Laser Cleaving and Polishing

Figure 25:
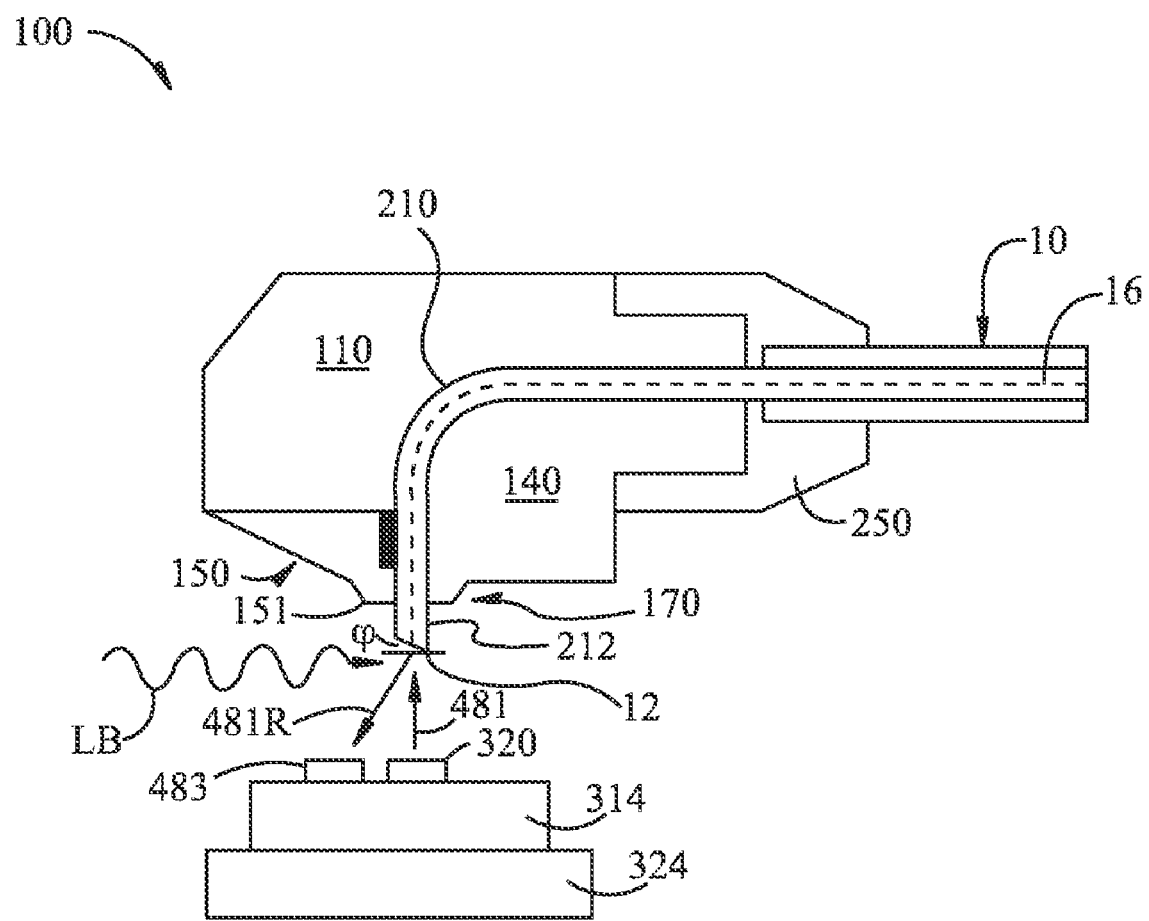
FIG. 25 is a schematic diagram of the coupler similar to that shown in FIG. 7, illustrating an example embodiment wherein a laser beam is used as a cleaving tool to cleave one or more optical fibers.

Laser cleaving and polishing is desirable for rapid low-cost fiber end preparation. FIG. 25 is a schematic diagram of coupler 100 similar to that shown in FIG. 7, illustrating an example embodiment wherein laser beam LB is used as a cleaving tool to form precision angled surfaces on fiber end 12. Laser beam LB is directed at the exposed fiber end 12 protruding from second I/O end 170. Depending on the incident angle of laser beam LB on fiber end 12, the fiber end can be laser polished flat or with a small cleave angle $\phi$ to minimize back reflections. If necessary, bottom surface 150 of coupler body 166 can be profiled (e.g., angled) to provide adequate laser beam access to fiber end 12. In an example embodiment, multiple fiber ends 12 are laser processed using laser beam LB.

Figure 26:
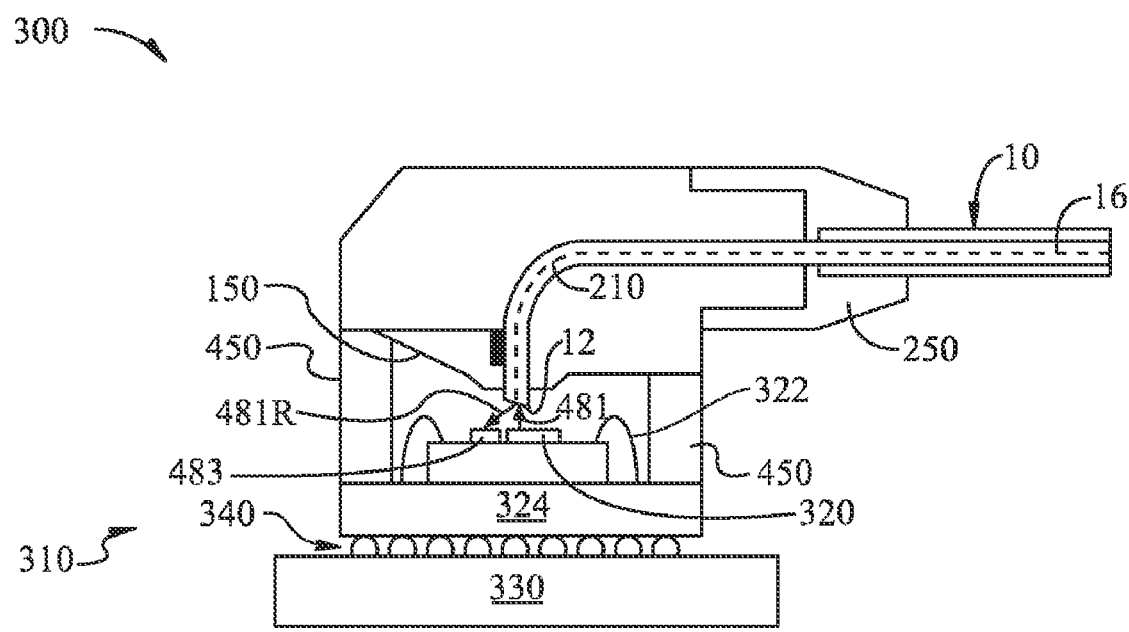
FIG. 26 is similar to FIG. 25 but shows the entire opto-electronic assembly, including a modified alignment structure that accommodates an altered bottom surface of lower alignment member to facilitate laser processing.

FIG. 26 is similar to FIG. 25 but shows the entire opto-electronic assembly 300, including a modified alignment structure 400 (and in particular the right support element 450) to accommodate the altered bottom surface 150 of lower alignment member 140.

In an example embodiment, one or more fiber ends 12 are angled so that a portion 481R of light 481 directed onto fiber core(s) 20 from one or more opto-electronic device 320 (e.g., a VCSEL array) from an opto-electronic device 310 is reflected downward to a detector array 483. In an example embodiment, fiber end 12 can be coated to achieve the appropriate amount of reflection.

Figure 27:
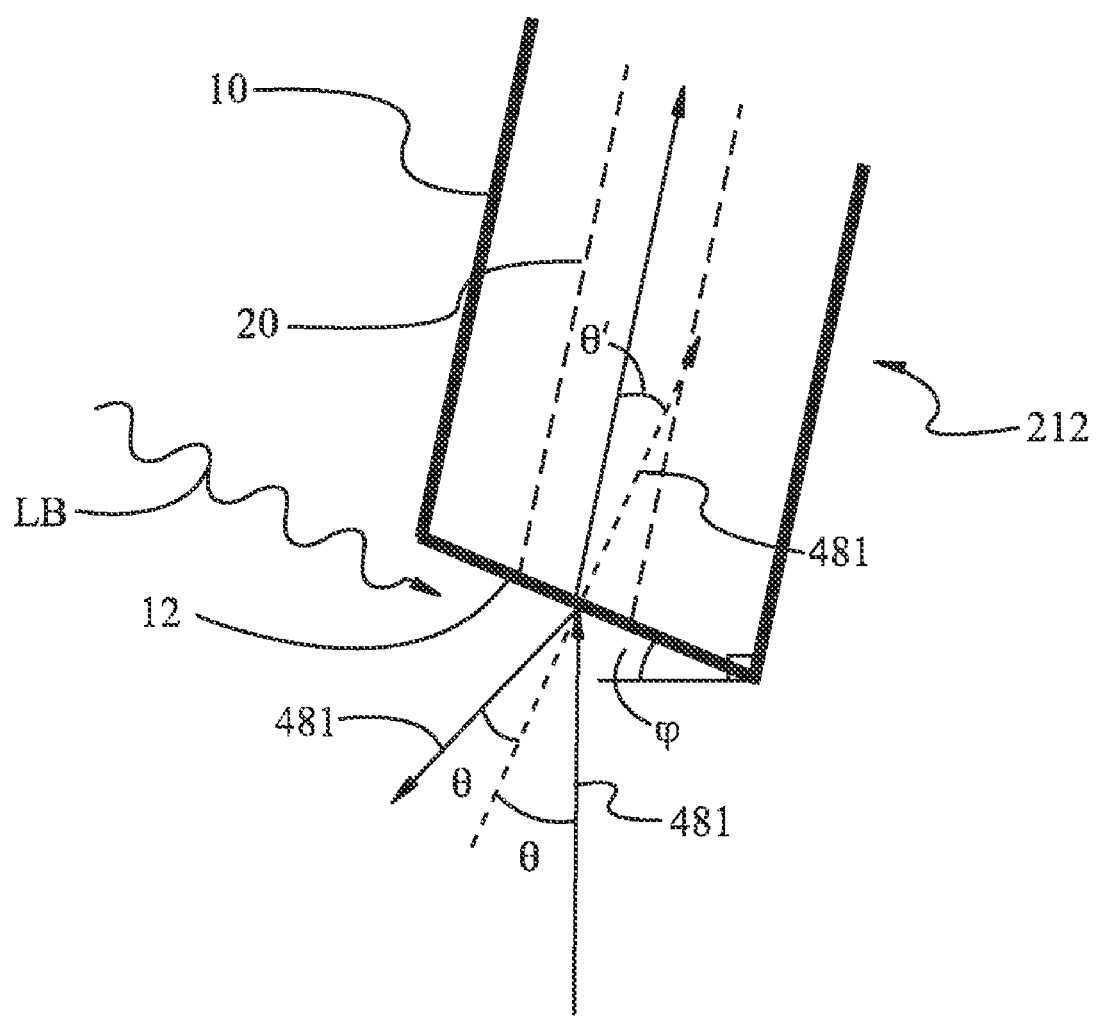
FIG. 27 is a close-up view of the laser-processed fiber end of FIG. 25, illustrating a tilted fiber and angled end as formed via laser processing.

FIG. 27 is a close-up view of fiber end 12 illustrating a tilted fiber 10 and angled end 12 as formed via laser processing, for example. FIG. 27 illustrates incident and reflecting light 481 and 481R, respectively, and a laser beam LB for cleaving the fiber 10. Incident light 481 has an incident and reflected angles $\theta$ and a transmitted angle $\theta'$.

Examples for various fiber cleave angles are: $\phi=15°$ fiber end angle cleave yields an 8° fiber tilt; $\phi=7°$ fiber end angle cleave (e.g., APC polish) gives a 3° fiber tilt.

Figure 28:
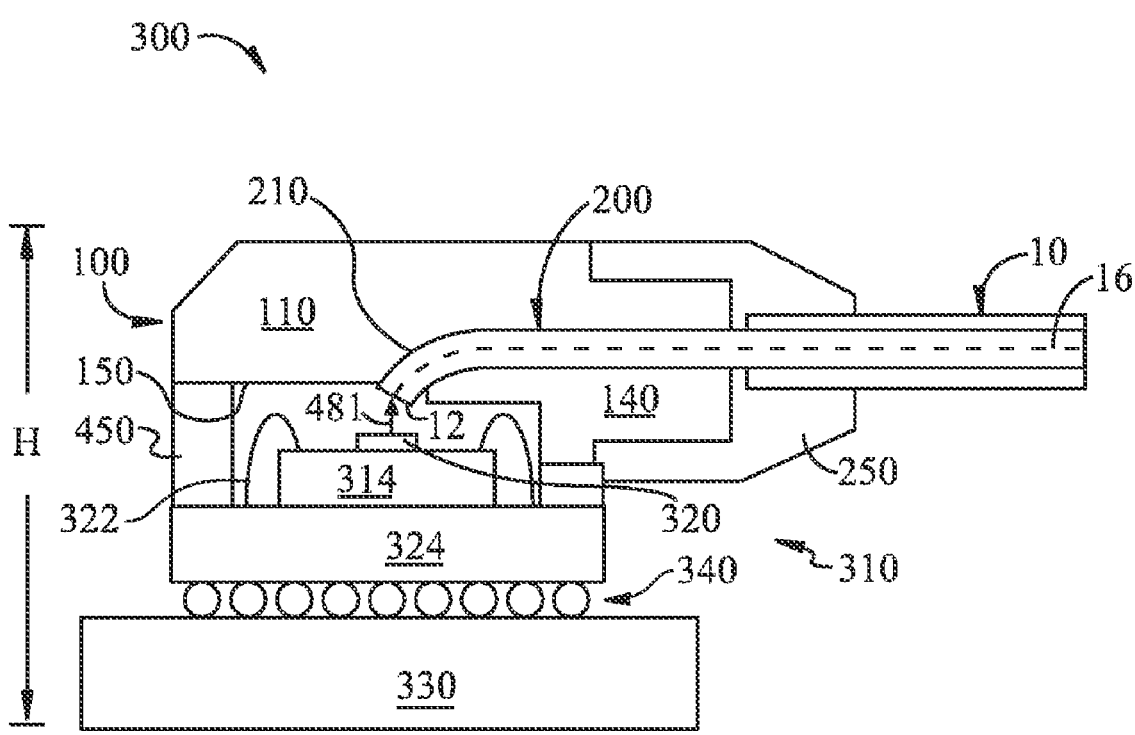
FIG. 28 is a schematic diagram of the coupler similar to that shown in FIG. 12, but with a cleaved fiber end, illustrating how the cleaved fiber results in an opto-electronic assembly having a reduced height H.

FIG. 28 is a schematic diagram of coupler 100 similar to that shown in FIG. 12, but with a cleaved fiber end 12, illustrating how cleaved fiber results in an opto-electronic assembly 300 of reduced height H. The reduction in height H as compared to the embodiment of opto-electronic assembly 300 shown in FIG. 12 is given (RC)·sin($\phi$), where RC is the fiber bend radius. For an 8° fiber tilt and RC=3.0 mm, the reduction in package height H is 0.42 mm. For RC=5.0 mm, the reduction in package height H is 0.7 mm.

Figure 29:
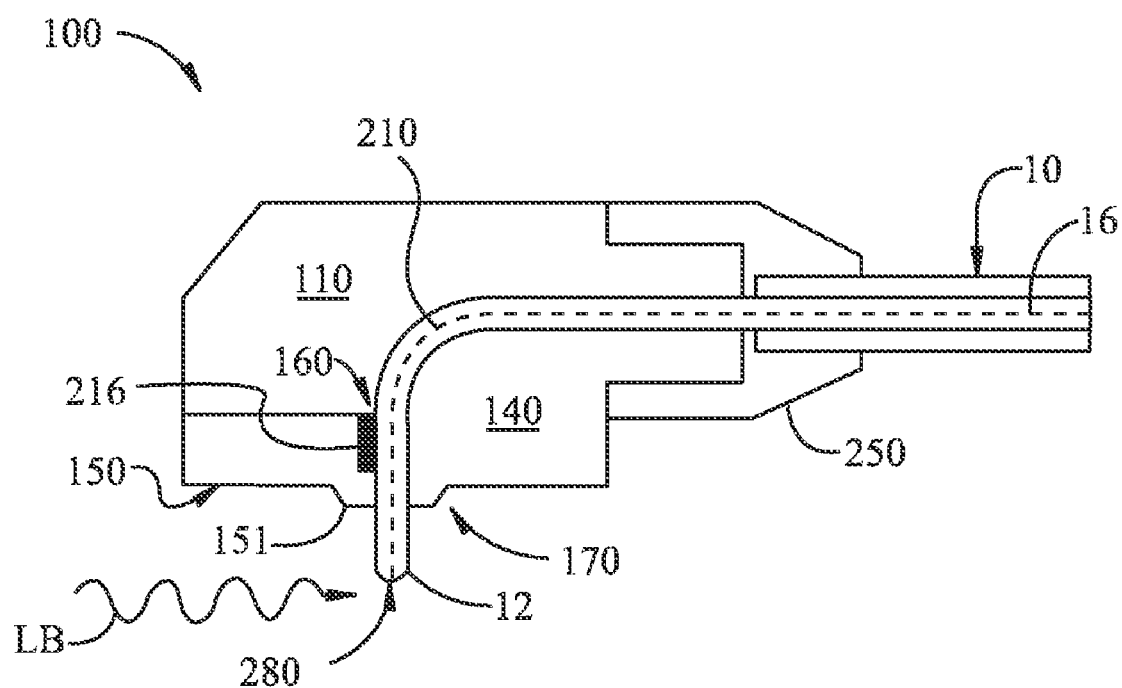
FIG. 29 is a schematic diagram of a coupler, wherein a laser beam is used to polish the one or more fiber ends to form corresponding one or more lenses at the ends of the fibers.

FIG. 29 is a schematic diagram of coupler 100 similar to that shown in FIG. 25, wherein laser beam LB is used to polish one or more fiber ends 12 to form corresponding one or more lenses 280 (see FIG. 10).

In Situ Bend-Loss Adjustment

Laser treatment of fiber bends 210 may result in modifications to the fiber core or surrounding materials. These modifications, such as collapse of voids 32, may alter the bend loss characteristics of fiber 10. With reference again to FIG. 22 and FIG. 23, in an example embodiment, laser heating via laser beam LB is used to adjust the bend loss in one or more fibers 12. In one example embodiment, this approach is used to selectively alter the output power across an array of fibers 12 so that each fiber meets certain output requirements (e.g., eye safety requirements).

Monolithic Coupler Body

Figure 30:
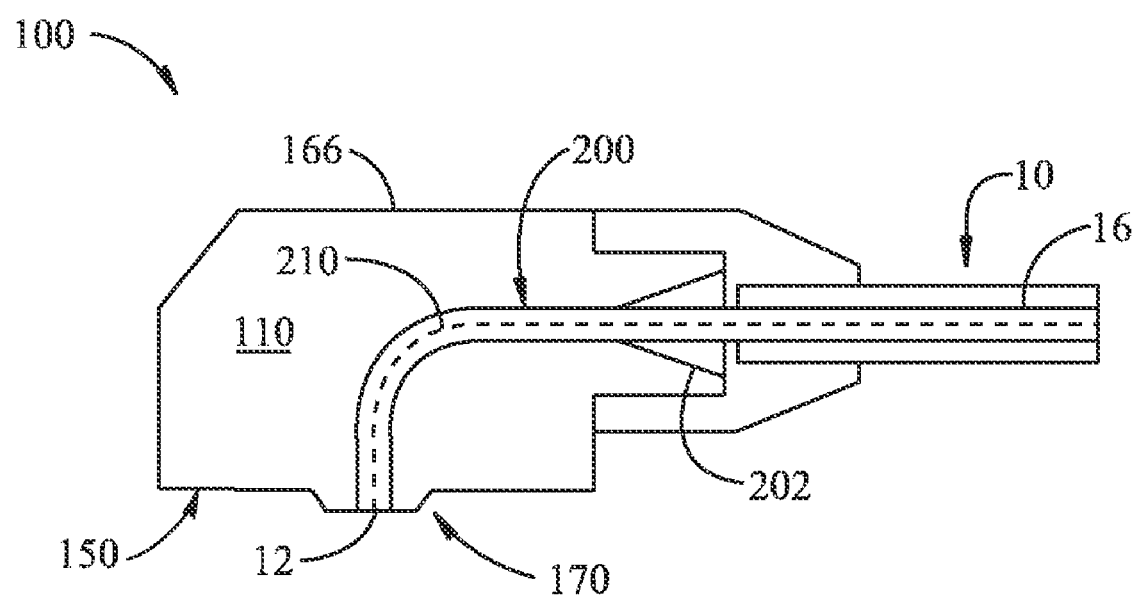
FIG. 30 is a schematic diagram of the coupler similar to that of FIG. 7, but illustrating an example embodiment having a coupler body that is monolithic.

FIG. 30 is a schematic diagram of coupler 100 similar to that of FIG. 7, but illustrating an example embodiment wherein coupler body 166 is monolithic rather than being formed from upper and lower alignment members 110 and 140. In an example embodiment, monolithic coupler body 166 is formed by injection molding, and curved fiber guide 200 is formed by forming one or more precision channels within the coupler body. In an example embodiment, fiber guide is formed with a right-angle bend to guide one or more fibers 10 into position at second I/O end 170. In an example embodiment, fiber guide 200 includes a funnel-like input end 202 to facilitate insertion of fiber(s) 10 into the fiber guide.

Mechanical Polishing

Figure 31:
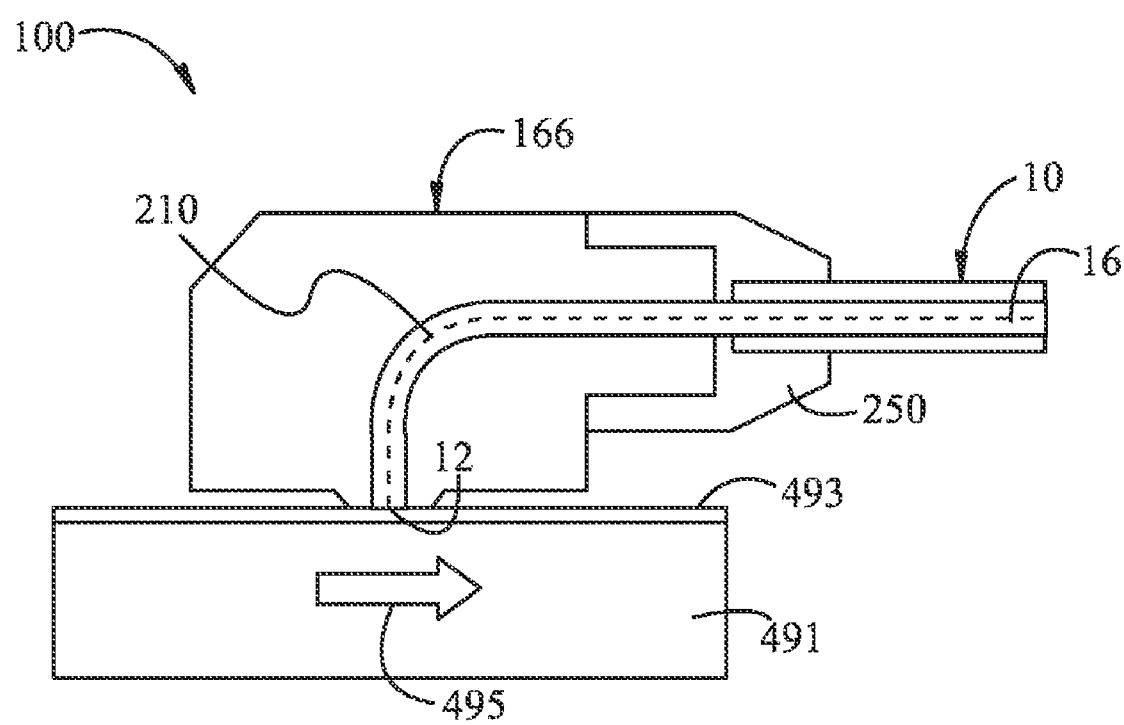
FIG. 31 is a schematic diagram similar to FIG. 30 and illustrates an example embodiment wherein a mechanical polisher is used to polish the one or more fiber ends.

In an example embodiment, one or more fiber ends 12 are mechanically polished before or after their incorporation into coupler 100. Fiber polishing after insertion is preferred because it avoids damage to polished fiber ends when the fiber is inserted into the coupler. FIG. 31 is a schematic diagram similar to FIG. 30 and illustrates an example embodiment wherein a mechanical polisher 491 having a polishing surface 493 is operably arranged at second I/O end 170. Mechanical polisher is arranged so that polishing surface 493 polishes fiber end 12 by the polisher moving relative to the fiber end, as indicated by arrow 495. The mechanical polishing approach is suitable for both single fibers 12, as well as multiple fibers, including fibers arranged in 1-D and 2-D fiber arrays.

Integral Coupler with Clamp

Figure 32:
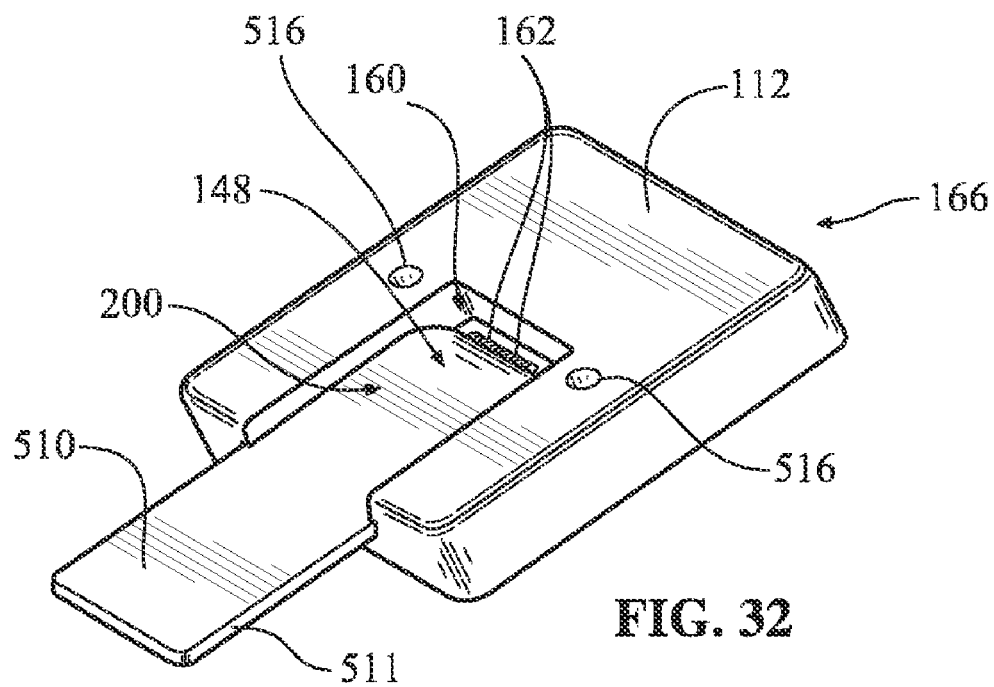
FIG. 32 is a top-down perspective view and FIG. 33 is a bottom-up perspective view of another example embodiment of an optical fiber coupler body.
Figure 33:
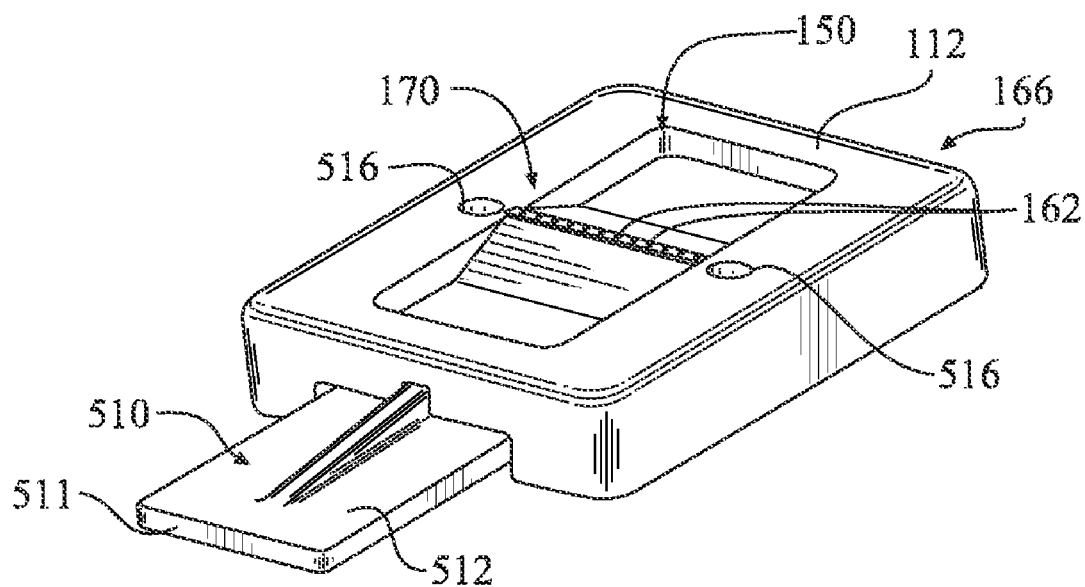
Figure 34:
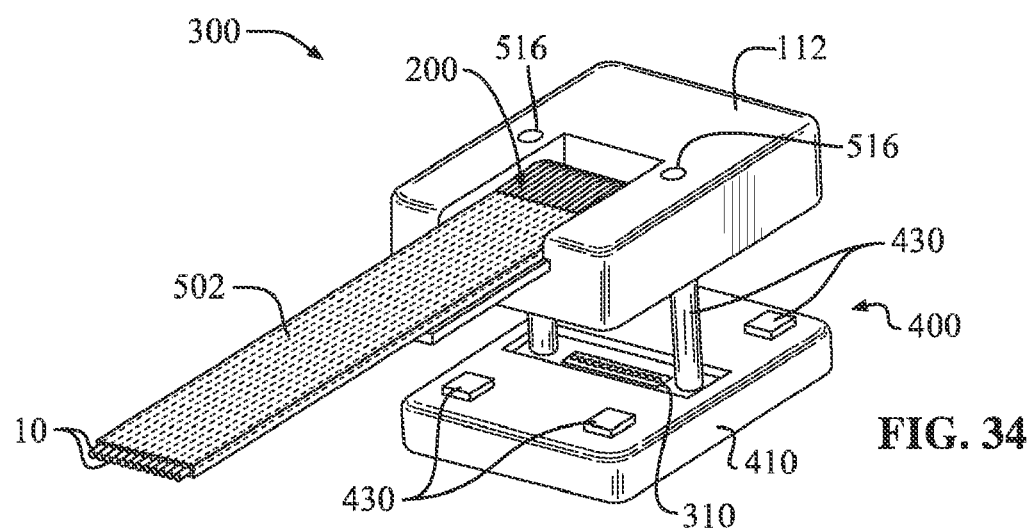
FIGS. 34 through 36 are perspective views of a coupler that uses the coupler body of FIGS. 32 and 33, shown along with an alignment structure and opto-electronic device.
Figure 35:
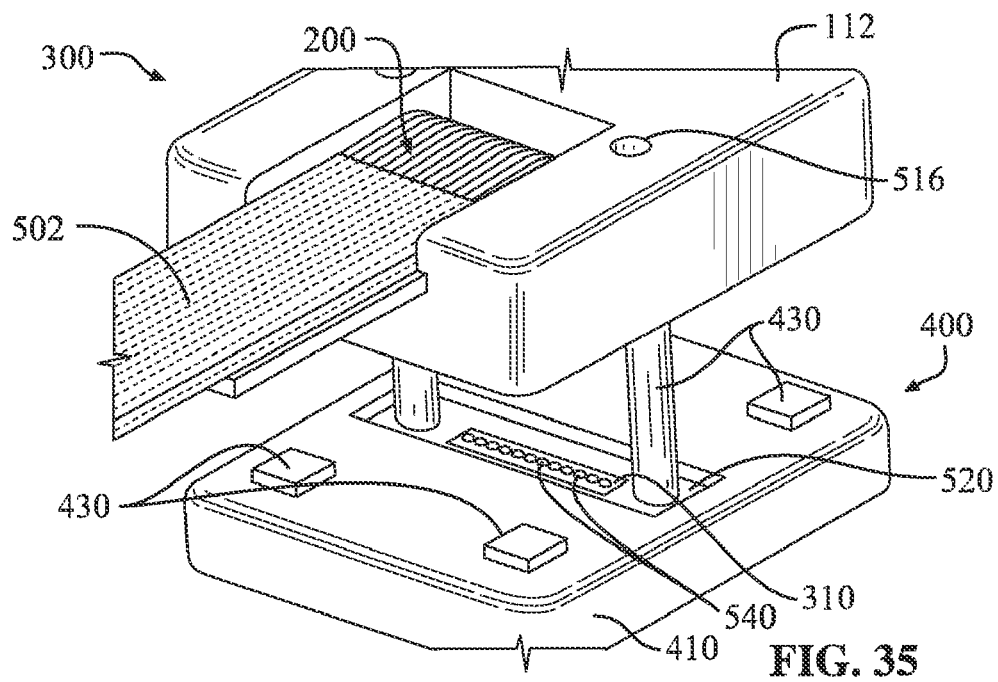
Figure 36:
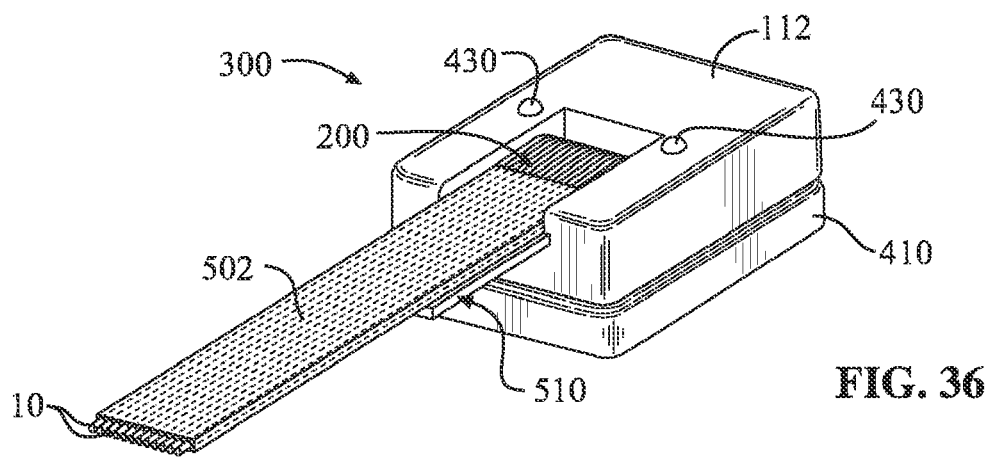

FIG. 32 is a top-down perspective view and FIG. 33 is a bottom-up perspective view of an example embodiment of a coupler body 166 for an example embodiment of coupler 100. FIGS. 34 through 36 are perspective views showing an example coupler 100 that uses coupler body 166 of FIGS. 32 and 33 in the process of being connected to an example alignment structure 400.

Coupler 100 of the present example embodiment employs multiple fibers 10 in the form of a fiber ribbon 502. Coupler body 166 is preferably formed as a unitary molded structure to include convex curved portion 148 and fiber guide 160 having a plurality of guide holes 162. In an example embodiment, coupler body 166 also includes a guide ramp 510 with edges 511 and a bottom surface 512. Guide ramp 510 is disposed at I/O end 168 to support fiber ribbon 502. In an example embodiment, bottom surface 150 and I/O end 170 thereat is configured as an MTP-type connector, including alignment holes 516. At this stage of forming coupler 100, fiber guide 200 is an open channel.

Referring now to FIGS. 34 and 35, mounting structure 400 includes alignment members 430 in the form of MTP-type alignment pins that are aligned with and sized to pass through alignment holes 516. Four other pad-type alignment members 430 are arranged at the corners of alignment substrate 410. Opto-electronic device 310 is disposed within a recessed region 520, and coupler 100 is lowered onto alignment substrate 410 while being guided by the alignment pins (see close up in FIG. 35). This results in fiber output end faces 12 at coupler I/O end 170 to be aligned with active surfaces 540 of opto-electronic device 310.

In performing the alignment process, the amount of optical power coupled into opto-electronic device 310 is monitored and the coupler's position is adjusted to optimize the monitored power. Once the alignment is optimized, a quick-curing adhesive such as the aforementioned UV-curable adhesive is used to secure opto-electronic assembly 300.

In forming coupler 100 of the present embodiment, to minimize damage to fibers 10 in the bend area of convex surface 148, only the fibers passing through guide holes 162 of fiber guide 160 are stripped. To insure largely epoxy free conditions for I/O end 170, an adequate length of fiber ribbon 502 is employed to insure that excess is carried well past the projected cut location at I/O end 170. An epoxy or other adhesive is added to fiber guide 160 and the ribbon inserted into curved optical fiber channel 200.

Figure 37:
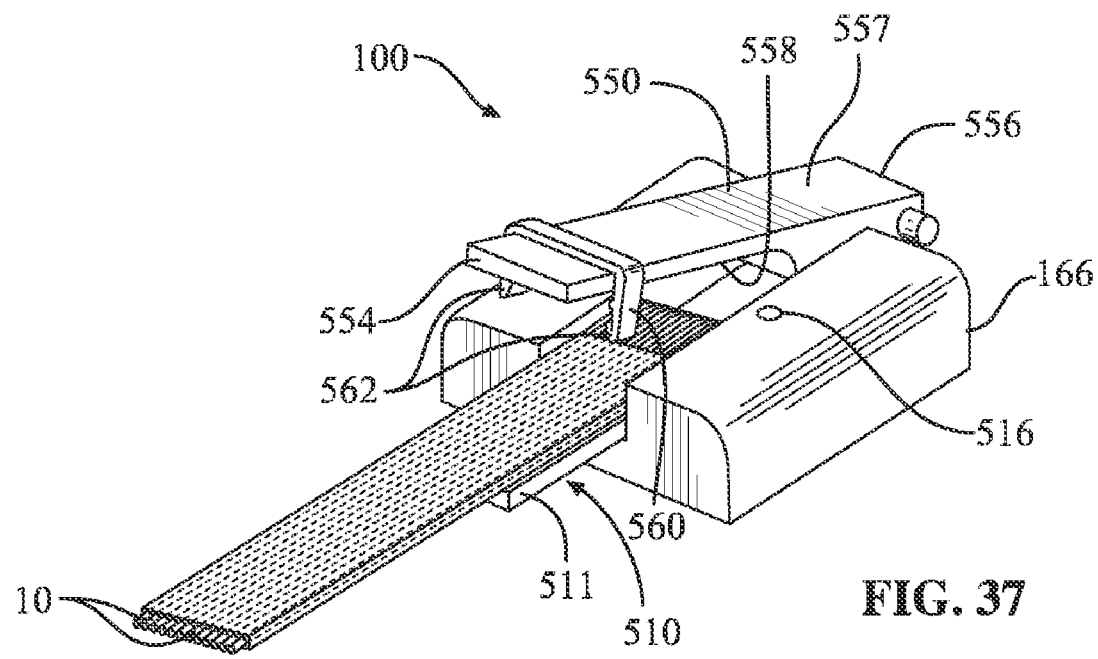
FIGS. 37 and 38 are perspective views of the coupler of FIGS. 34 through 36 showing an example clamp used to secure the fiber ribbon.
Figure 38:
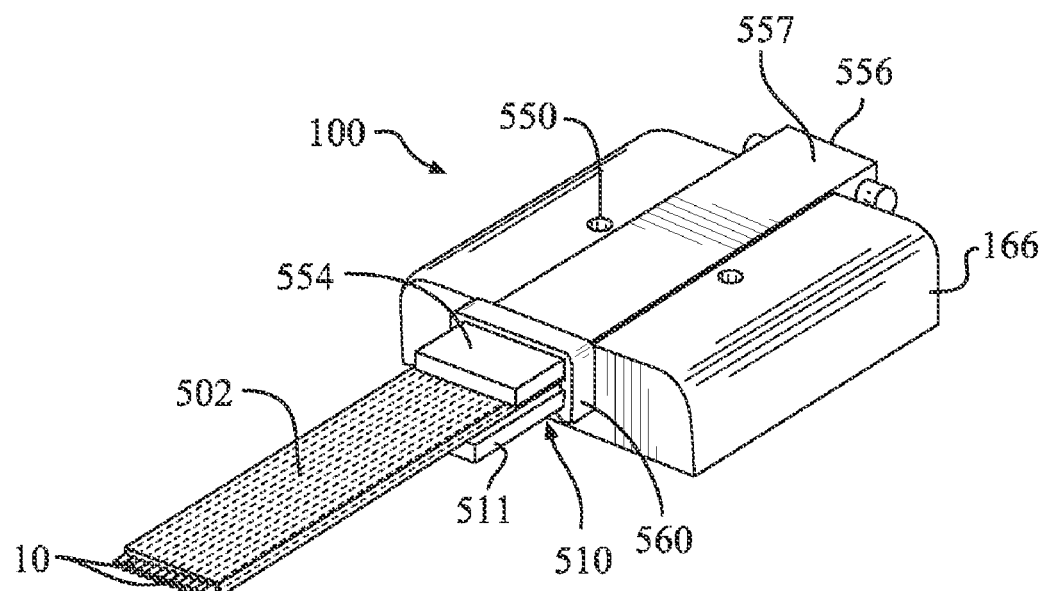

FIG. 37 and FIG. 38 are top-down perspective views of coupler 100 showing a clamp 550 with front and rear ends 554 and 556, a top surface 557 and a bottom surface 558. Clamp 550 includes downwardly depending prongs 560 at or near front end 554 that include inwardly angled tabs 562. Clamp rear end 556 is hinged to or is otherwise rotatably affixed to coupler body end 126. Clamp 550 is then rotated so that clamp bottom surface 558 contacts fiber ribbon 502 (FIGS. 37 and 38). Clamp bottom surface 558 includes a convex surface for holding, in conjunction with concave surface 148, the fiber ribbon 502. Simultaneously therewith, angle tabs 562 engage guide ramp edges 511 and bottom surface 512. In an example embodiment, additional epoxy or adhesive is added to the top of fiber ribbon 502 so that the fiber ribbon is further affixed to clamp 550 when the clamp is closed.

In an example embodiment, at this stage coupler 10 is loaded into a laser cut station (not shown) and fibers 10 that were initially allowed to extend beyond I/O end 170 can be cut and/or polished at or near I/O end 170. The cut can be perpendicular to the plane of bottom surface 150 or at an angle thereto. In an example embodiment, the newly cut and/or polished fiber ends 12 are made flush with I/O end 170. Note that bottom surface 150 and I/O end 170 are formed in a manner that facilitates laser processing of fibers 10 at I/O end 170 (see FIG. 33)

Figure 39:
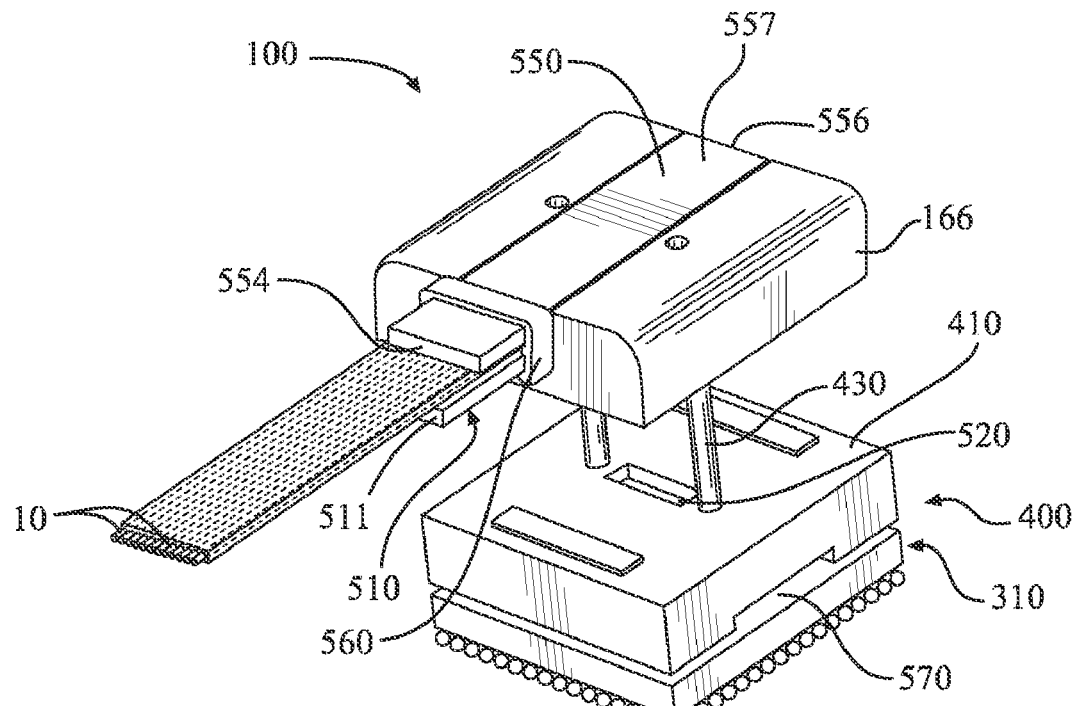
FIG. 39 is a perspective view of the coupler as shown in FIGS. 37 and 38 in the process of being mounted to an opto-electronic device using an alignment structure to form an opto-electronic assembly.
Figure 40:
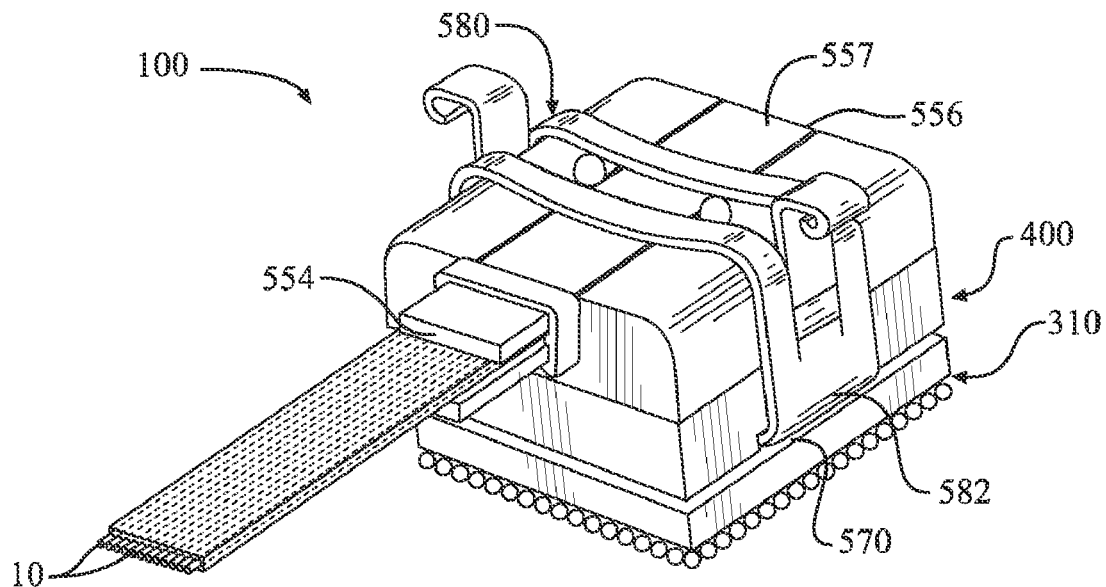
FIG. 40 is a perspective view of the opto-electronic assembly of FIG. 39, together with a spring clip.

FIG. 39 and FIG. 40 are perspective diagrams that show coupler 100 as formed in FIG. 37 and FIG. 38 being aligned and operably connected to opto-electronic device 310 using alignment structure 400. FIG. 39 and FIG. 40 show an example embodiment where alignment substrate 410 includes indentations 570. In the example embodiment shown in FIG. 40, a spring-clip 580 with ends 582 that engage alignment substrate indentations 570 is used to further secure coupler 100 to opto-electronic device 310 and thus keep opto-electronic assembly 300 intact.

Fiber Assembly

Figure 41:
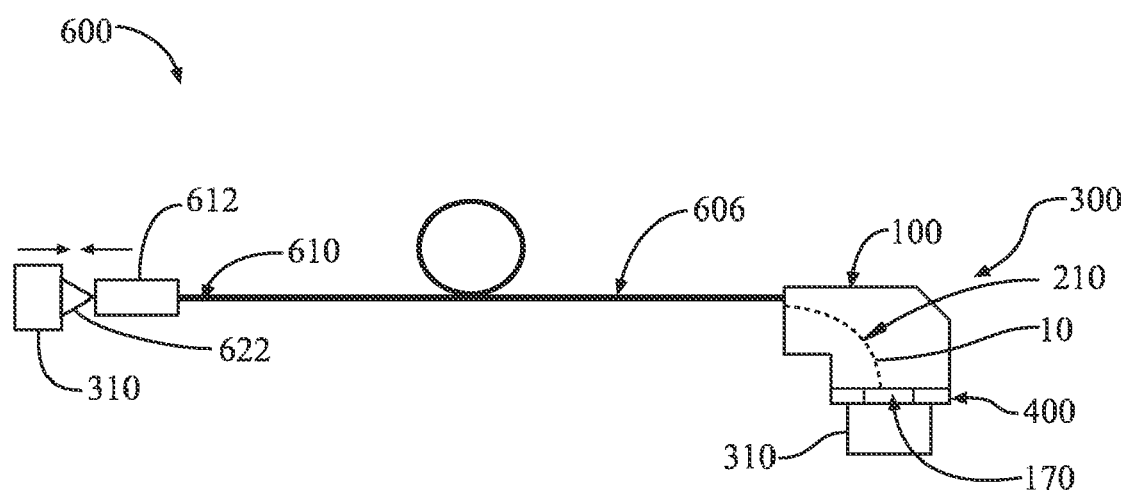
FIG. 41 is a schematic diagram of an example embodiment of an opto-electronic fiber assembly that includes a fiber optic cable and a coupler, along with opto-electronic devices respectively coupled to the coupler and to a connector at opposite ends of the cable.

FIG. 41 is a schematic diagram of an example embodiment of a fiber assembly 600 that employs coupler 100. In an example embodiment, fiber assembly 600 includes a fiber-optic cable 606 that includes one or more fibers 10, such as nanostructured fibers, for example, and in an example embodiment includes fiber ribbon. Cable 606 includes a connectorized end 610 that includes a connector 612. Fiber assembly 600 includes opto-electronic assembly 300 (including an opto-electronic device 310) at one end of cable 606 and another opto-electronic device 310 optically connected to the cable via connector 612.

In an example embodiment, opto-electronic device 310 at the connectorized cable end is an optical receiver, and opto-electronic device 310 of opto-electronic assembly 300 is an optical transmitter, e.g., the aforementioned VCSEL assembly. In an example embodiment, fiber assembly 600 presents an industry-standard interface to electronic devices at one or both ends of the assembly (e.g., SFP, MTF, USB, etc.).

In an example embodiment where opto-electronic device 310 at the connectorized end of cable 606 is a transmitter and the other opto-electronic device is a detector, and the transmitter generates light 622 that is coupled into fibers 10 via connector 612 (connector 612 and transmitter 310 are shown separated for the sake of illustration). Light signals 622 are guided by fibers 10 and exits coupler I/O end 170, where the light signals are then received by detector 310 wherein the light signals are converted to electrical signals (not shown). Opto-electronic device 310 at I/O end 170 may also include electronic processing elements (not shown) for processing the electrical signals.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An optical coupler comprising:
   an upper fiber alignment member having a concave surface;
   a lower fiber alignment member having a convex surface and a bottom surface defining a coupler output end, wherein the lower and upper fiber alignment members are arranged to form a first fiber guide channel defining a first coupler input/output (I/O) end, and a central curve defined by said convex and concave surfaces; and
   at least one optical fiber having an end portion with a proximal end face, wherein at least a portion of the at least one optical fiber is held within and supported by the first fiber guide channel so as to form a bend in the at least one optical fiber corresponding to the central curve, and to position the proximal fiber end face at or near the bottom surface of the lower fiber alignment member so as to define a second coupler I/O end.

2. The optical coupler of claim 1, wherein the at least one optical fiber has an attenuation increase of less than or equal to 5 dB at a wavelength of 1550 nm when subject to one turn around a 10 mm diameter mandrel.

3. The assembly of claim 1, wherein the lower alignment member comprises a heat shield disposed adjacent an inside portion of the fiber bend.

4. The coupler of claim 1, wherein the central curve is a substantially right-angled bend.

5. The coupler of claim 1, wherein said central curve has a bend radius RC wherein $1\ mm \leq RC \leq 15\ mm$.

6. The coupler of claim 1, further comprising a divider member arranged within the first fiber guide channel to divide the channel into a plurality of channels each having at least one optical fiber.

7. The coupler of claim 1, wherein the bend formed in the at least one optical fiber does not cause an attenuation of greater than 0.1 dB.

8. The coupler of claim 1, further comprising an optical detector arranged adjacent an outside portion of the optical fiber bend so as to detect light exiting the at least one optical fiber at the bend.

9. The coupler of claim 1, wherein the proximal end face of the at least one optical fiber is oblique to a center line of the at least one optical fiber.

10. The coupler of claim 1, wherein the proximal end face of the at least one optical fiber includes an integrally formed lens.

11. An opto-electronic assembly, comprising:
the coupler of claim 1; and
an opto-electronic device optically coupled the second I/O end of the coupler, wherein the opto-electronic device comprises at least one device selected from the group of devices comprising: an optical detector, an optical light source and at least one vertical-cavity surface-emitting laser (VCSEL).

12. The assembly of claim 11, comprising a plurality of staggered lower alignment members configured to support a corresponding plurality of optical fibers so that the optical fiber end faces are staggered relative to one another at the second I/O end.

13. A method of forming an optical coupler comprising:
providing at least one optical fiber having an end portion with a proximal end face;
holding the at least one optical fiber between respective concave and convex surfaces of upper and lower fiber alignment guides so as to form and support a bend in the at least one optical fiber, wherein the bend formed in the at least one optical fiber does not cause an attenuation of greater than 0.1 dB.

14. The method of claim 13, wherein the at least one optical fiber has an attenuation increase of less than or equal to 5 dB at a wavelength of 1550 nm when subject to one turn around a 10 mm diameter mandrel.

15. The method of claim 13, further comprising:
bending the at least one optical fiber over the convex surface of the lower alignment guide;
applying a curable adhesive layer to the convex surface and the at least one optical fiber so as to form the upper alignment member; and
curing the curable adhesive layer.

16. The method of claim 13, further comprising:
at least partially bending the at least one optical fiber over the convex surface of the lower alignment guide; and
irradiating the bend in the at least one optical fiber with a laser beam prior to holding the at least one optical fiber between the respective concave and convex surfaces of the upper and lower fiber alignment guides.

17. The method of claim 13, further including laser processing the proximal end face of the at least one optical fiber as the at least one optical fiber is being held between the respective concave and convex surfaces of the upper and lower fiber alignment guides.

18. The method of claim 13, further comprising mechanically polishing the proximal end face of the at least one optical fiber, using a mechanical polisher, as the at least one optical fiber is being held between the respective concave and convex surfaces of the upper and lower fiber alignment guides.

19. An optical coupler comprising:
a coupler body having a top surface, bottom surface and a central fiber guide channel formed in the top surface, the central fiber guide channel sized to accommodate a fiber ribbon and having a convex curved surface and input and output ends;
an optical fiber guide formed integral with the coupler body and arranged at the channel output end of central fiber guide channel and having a plurality of holes open to the bottom surface and defining an input/output (I/O) end;
a fiber ribbon comprising a plurality of optical fibers with respective end portions and proximal end faces, with the fiber ribbon disposed in the central fiber guide channel so as to have a bend, and to position end portions of the optical fibers within the fiber guide holes so that the fiber end faces are disposed at the coupler I/O end, wherein the optical fibers have an attenuation increase of less than or equal to 5 dB at a wavelength of 1550 nm when subject to one turn around a 10 mm diameter mandrel; and
a clamp having a concave surface that covers the fiber ribbon within the central fiber guide channel and that serves to secure the fiber ribbon therein.

20. A coupler assembly, comprising:
the coupler of claim 19, wherein the coupler body comprises at least two alignment holes in the bottom surface;
an opto-electronic device optically coupled to the I/O end; and
an alignment structure having at least two alignment pins that engage the at least two alignment holes so as to facilitate aligning the coupler to the opto-electronic device.

21. A method of producing an optical coupler, comprising:
providing an optical fiber with an end portion;
disposing the optical fiber in a central fiber guide channel of a coupler body so as to form a bend in the optical fiber;
positioning the fiber end portion within a hole of an end fiber guide of the coupler body so that the fiber end portion extends from an end of the end fiber guide; and
laser processing the fiber end portion that extends from the end of the end fiber guide to form a fiber end face.

22. The method of claim 21, wherein the laser processing further comprises forming the fiber end face so as to be flush with the end fiber guide end.

* * * * *